US012672563B2

(12) United States Patent
Kim et al.

(10) Patent No.: US 12,672,563 B2
(45) Date of Patent: Jun. 30, 2026

(54) PACKAGE SUBSTRATE WITH BRANCH LINE PATTERNS AND SEMICONDUCTOR PACKAGE INCLUDING THE SAME

(71) Applicant: Samsung Electronics Co., Ltd., Suwon-si (KR)

(72) Inventors: Seungmin Kim, Asan-si (KR); Byungsu Kim, Cheonan-si (KR); Hwanwook Jung, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 762 days.

(21) Appl. No.: 17/958,952

(22) Filed: Oct. 3, 2022

(65) Prior Publication Data

US 2023/0260888 A1      Aug. 17, 2023

(30) Foreign Application Priority Data

Feb. 17, 2022      (KR) ........................ 10-2022-0021043

(51) Int. Cl.
H10W 70/65        (2026.01)
H10W 70/685        (2026.01)
    (Continued)

(52) U.S. Cl.
CPC ......... H10W 70/65 (2026.01); H10W 70/685 (2026.01); H10W 72/0198 (2026.01);
    (Continued)

(58) Field of Classification Search
CPC ......... H01L 23/49838; H01L 23/49816; H01L 23/49822; H01L 23/48; H01L 23/31;
    (Continued)

(56) References Cited

U.S. PATENT DOCUMENTS 5,036,380 A      7/1991   Chase
5,821,609 A      10/1998   DiStefano et al.
    (Continued)

FOREIGN PATENT DOCUMENTS

KR      1020200019041 A      2/2020

OTHER PUBLICATIONS

Extended European Search Report issued Jun. 26, 2023 for corresponding EP Patent Application No. 23150667.6.

Primary Examiner — Wael M Fahmy
Assistant Examiner — Tiberiu Dan Onuta
(74) Attorney, Agent, or Firm — Muir Patent Law, PLLC

(57) ABSTRACT

A package substrate includes a base insulating layer, a first main line pattern on a first surface of the base insulating layer, a plurality of first conductive pads on the first surface of the base insulating layer, a plurality of first branch line patterns on the first surface of the base insulating layer, the plurality of first branch line patterns extending between the first main line pattern and the plurality of first conductive pads; and a first insulating layer on the first surface of the base insulating layer, the first insulating layer including a plurality of first through grooves. Each of the plurality of first branch line patterns includes a first cut portion, a first segment and a second segment separated from each other by the first cut portion, and the plurality of first through grooves overlap first cut portions.

20 Claims, 30 Drawing Sheets

10

(51) Int. Cl.

| | |
|---|---|
| *H10W 72/00* | (2026.01) |
| *H10W 74/00* | (2026.01) |
| *H10W 74/01* | (2026.01) |
| *H10W 74/15* | (2026.01) |
| *H10W 90/00* | (2026.01) |

(52) U.S. Cl.

CPC ....... *H10W 74/012* (2026.01); *H10W 74/014* (2026.01); *H10W 74/016* (2026.01); *H10W 74/15* (2026.01); *H10W 90/701* (2026.01); *H10W 74/00* (2026.01); *H10W 90/724* (2026.01); *H10W 90/734* (2026.01)

(58) Field of Classification Search

CPC ........... H01L 23/3128; H01L 23/49861; H01L 23/49844; H01L 21/561; H01L 21/563; H01L 21/565; H01L 21/4857; H01L 24/16; H01L 24/32; H01L 24/73; H01L 24/96; H01L 24/97; H01L 2224/16227; H01L 2224/16237; H01L 2224/32225; H01L 2224/73204; H01L 2924/182; H01L 22/14; H01L 22/32

See application file for complete search history.

(56) References Cited

U.S. PATENT DOCUMENTS

| | | | |
|---|---|---|---|
| 6,300,577 B1 | 10/2001 | Tsujii | |
| 6,872,590 B2 | 3/2005 | Lee et al. | |
| 7,768,116 B2 | 8/2010 | Yoon et al. | |
| 9,743,533 B2 | 8/2017 | Tsai | |
| 9,818,611 B2 | 11/2017 | deVilliers | |
| 10,991,598 B2 | 4/2021 | Choi et al. | |
| 11,127,634 B2 | 9/2021 | Seddon | |
| 2010/0126765 A1 | 5/2010 | Kim et al. | |
| 2016/0343677 A1* | 11/2016 | Meyer | H10W 74/129 |
| 2019/0221446 A1* | 7/2019 | Huang | H10W 70/05 |
| 2020/0098679 A1* | 3/2020 | Sato | H10W 70/65 |

* cited by examiner

PACKAGE SUBSTRATE WITH BRANCH LINE PATTERNS AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2022-0021043, filed on Feb. 17, 2022, in the Korean Intellectual Property Office, the disclosure of which is incorporated by reference herein in its entirety.

BACKGROUND

The inventive concept relates to a package substrate and a semiconductor package including the same.

In general, a semiconductor package is manufactured by mounting a semiconductor chip on a printed circuit board and molding the semiconductor chip with molding resin. Recently, to increase the productivity of manufacturing semiconductor packages, semiconductor packages have been manufactured by mounting a plurality of semiconductor chips on a panel-shaped substrate, in which a plurality of printed circuit boards are connected to each other, molding the semiconductor chips with molding resin, and cutting a molded structure into individual packages.

SUMMARY

The inventive concept provides a package substrate and a semiconductor package including the same.

According to an aspect of the inventive concept, there is provided a package substrate including a base insulating layer including a first surface and a second surface opposite to the first surface; a first main line pattern on the first surface of the base insulating layer; a plurality of first conductive pads on the first surface of the base insulating layer; a plurality of first branch line patterns on the first surface of the base insulating layer, each first branch line pattern among the plurality of first branch line patterns extending between the first main line pattern and a corresponding first conductive pad among the plurality of first conductive pads; and a first insulating layer on the first surface of the base insulating layer, the first insulating layer including a plurality of first through grooves spaced apart from the first main line pattern. Each first branch line pattern of the plurality of first branch line patterns includes a first cut portion, a first segment, and a second segment. The first segment and the second segment are separated from each other by the first cut portion between the first segment and the second segment. Each first through groove of the plurality of first through grooves overlaps a first cut portion of a corresponding first branch line pattern among the plurality of first branch line patterns.

According to an aspect of the inventive concept, there is provided a package substrate including a base insulating layer including a first surface and a second surface opposite to the first surface; a first main line pattern extending along a first straight line extending in a first direction on the first surface of the base insulating layer; a plurality of first conductive pads on the first surface of the base insulating layer; a plurality of first branch line patterns on the first surface of the base insulating layer, each first branch line pattern of the plurality of first branch line patterns extending between the first main line pattern and a corresponding first conductive pad among the plurality of first conductive pads;

and a first insulating layer on the first surface of the base insulating layer, the first insulating layer including a plurality of first through grooves. The plurality of first branch line patterns are connected to the first main line pattern at a plurality of contact points that are spaced apart from each other in the first direction. Each first branch line pattern of the plurality of first branch line patterns includes a first cut portion, a first segment, and a second segment, the first segment and the second segment being separated from each other by the first cut portion between the first segment and the second segment. Each first through groove among the plurality of first through grooves overlaps a first cut portion of a corresponding first branch line pattern among the plurality of first branch line patterns. When viewed in a plan view, two adjacent first through grooves, in a diagonal direction between the first direction and a second direction, among the plurality of first through grooves are spaced apart from each other by the first main line pattern therebetween, the second direction being perpendicular to the first direction.

According to an aspect of the inventive concept, there is provided a semiconductor package including a package substrate and a semiconductor chip mounted on the package substrate, wherein the package substrate includes a base insulating layer including a first surface and a second surface opposite to the first surface; a plurality of first conductive pads on the first surface of the base insulating layer; a plurality of first branch line patterns on the first surface of the base insulating layer, the plurality of first branch line patterns being connected to the plurality of first conductive pads; and a first insulating layer on the first surface of the base insulating layer, the first insulating layer including a plurality of first through grooves. When viewed in a plan view, the plurality of first conductive pads are arranged in a first direction. When viewed in the plan view, each first branch line pattern of the plurality of first branch line patterns extends along a straight line extending in a second direction different from the first direction and extends from a corresponding first conductive pad among the plurality of first conductive pads toward a corresponding first through groove among the plurality of first through grooves, the corresponding first conductive pad and the corresponding first through groove being arranged along the straight line extending in the second direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
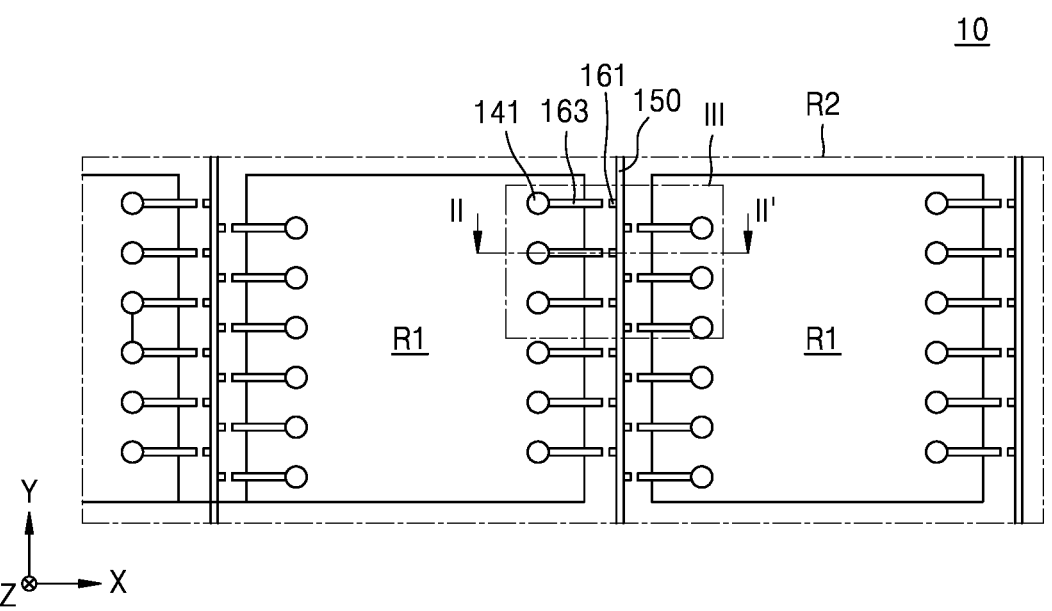
FIG. 1 is a layout diagram of a package substrate according to example embodiments.

Hereinafter, embodiments will be described with reference to the attached drawings. In the drawings, like numerals denote like elements and redundant descriptions thereof will be omitted.

Figure 2:
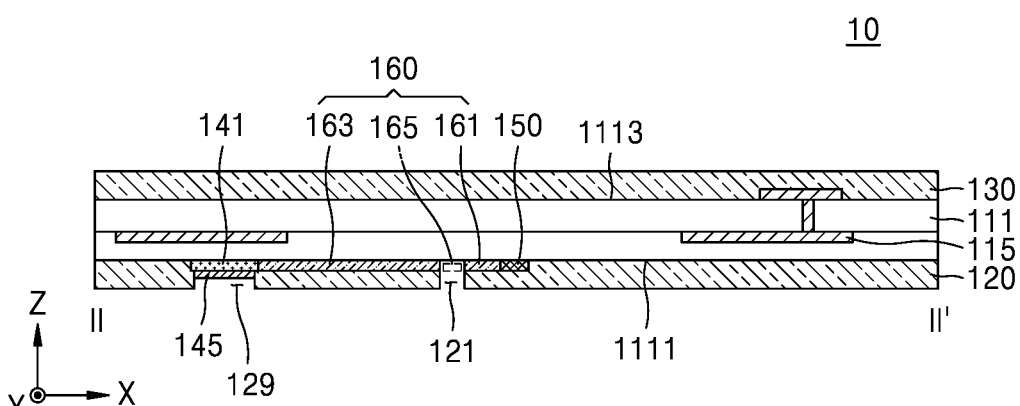
FIG. 2 is a cross-sectional view of the package substrate that is taken along line II-II' in FIG. 1.
Figure 3:
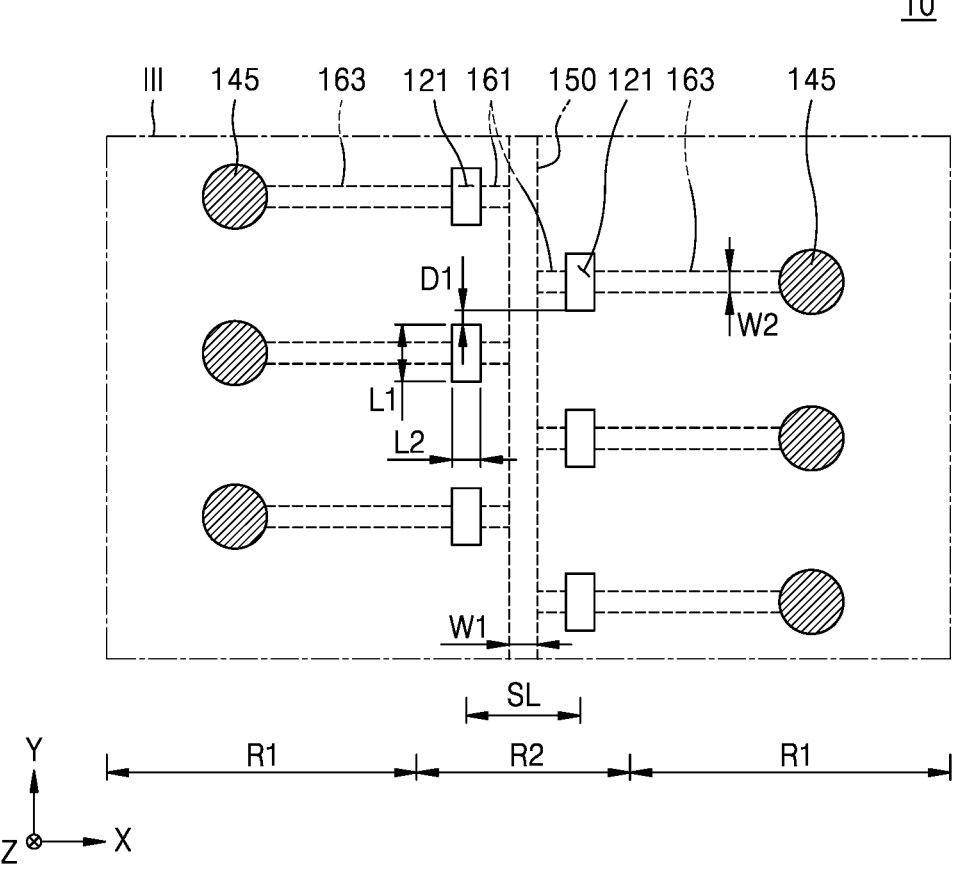
FIG. 3 is a bottom view of region III in the package substrate of FIG. 1.

FIG. 1 is a layout diagram of a package substrate 10 according to example embodiments. FIG. 2 is a cross-sectional view of the package substrate 10 that is taken along line II-II' in FIG. 1. FIG. 3 is a bottom view of region III in the package substrate 10 of FIG. 1.

Referring to FIGS. 1 to 3, the package substrate 10 may include a first region R1 and a second region R2, which are separated or divided from each other in a plan view. The package substrate 10 may include at least one first region R1. An electronic part, such as a semiconductor chip 210 (see FIG. 7), may be mounted on the first region R1. The first region R1 may have a rectangular shape in a plan view, as shown in FIG. 1, but embodiments are not limited thereto. The first region R1 may have a polygonal shape, such as a pentagonal shape and a circular shape in a plan view. The second region R2 may surround the first region R1 in a plan view. In other words, the second region R2 may extend along the edge of the first region R1 in a plan view. The second region R2 may include a scribe lane SL, which is removed by a cutting process. As shown in FIG. 1, the package substrate 10 may include a plurality of first regions R1 and the second region R2, which separates the first regions R1 from each other. The arrangement and number of first regions R1 in FIG. 1 are just examples, and the first regions R1 may be arranged in a two-dimensional array having at least two rows and at least two columns.

The package substrate 10 may include a base insulating layer 111, a first insulating layer 120, a second insulating layer 130, an internal interconnect structure 115, a plurality of first conductive pads 141, a plurality of first conductive cover layers 145, a first main line pattern 150, and a plurality of first branch line patterns 160.

The base insulating layer 111 may have a plate shape or a panel shape. The base insulating layer 111 may include a first surface 1111 and a second surface 1113 opposite to the first surface 1111. The first surface 1111 and the second surface 1113 may be flat. Hereinafter, a direction parallel with the first or second surface 1111 or 1113 of the base insulating layer 111 is defined as a horizontal direction (e.g., an X direction and/or a Y direction), and a direction perpendicular to the first or second surface 1111 or 1113 of the base insulating layer 111 is defined as a vertical direction (e.g., a Z direction). A horizontal width of an element may refer to a length in the horizontal direction (e.g., the X direction and/or the Y direction), and a vertical height or thickness of the element may refer to a length in the vertical direction (e.g., the Z direction).

The base insulating layer 111 may include or may be formed of at least one material selected from phenol resin, epoxy resin, and polyimide. For example, the base insulating layer 111 may include or may be formed of at least one material selected from polyimide, frame retardant 4 (FR4), tetrafunctional epoxy, polyphenylene ether, epoxy/polyphenylene oxide, bismaleimide triazine (BT), thermount, cyanate ester, and liquid crystal polymer.

The first insulating layer 120 may be on the first surface 1111 of the base insulating layer 111. The first insulating layer 120 may extend along the first surface 1111 of the base insulating layer 111 and cover the first surface 1111 of the base insulating layer 111. For example, the first insulating layer 120 may include or may be formed of solder resist.

The second insulating layer 130 may be on the second surface 1113 of the base insulating layer 111. The second insulating layer 130 may extend along the second surface 1113 of the base insulating layer 111 and cover the second surface 1113 of the base insulating layer 111. For example, the second insulating layer 130 may include or may be formed of solder resist.

The internal interconnect structure 115 may include a conductive layer inside the base insulating layer 111, a conductive layer on the first surface 1111 and/or the second surface 1113 of the base insulating layer 111, and/or a conductive via extending in the base insulating layer 111 in the vertical direction (e.g., the Z direction). The conductive via may be connected to the conductive layer inside the base insulating layer 111 and/or the conductive layer on the first surface 1111 and/or the second surface 1113 of the base insulating layer 111. The internal interconnect structure 115 may be electrically connected to the first conductive pads 141, the first main line pattern 150, and/or the first branch line patterns 160.

The first conductive pads 141 may be on the first surface 1111 of the base insulating layer 111. The first conductive pads 141 may be located to respectively overlap first pad openings 129 of the first insulating layer 120. For example, each first pad opening of the first pad openings 129 may expose a corresponding first conductive pad of the first conductive pads 141. The first conductive pads 141 may function as pads, to which connecting members (e.g., conductive bumps, conductive wires, and solder balls) for electrically and physically connecting the package substrate 10 to other electronic parts are respectively attached. The first conductive pads 141 may be arranged in the first region R1 of the package substrate 10.

For example, the first conductive pads 141 may include or may be formed of metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof.

The first conductive cover layers 145 may respectively extend along the surfaces of the first conductive pads 141. The first conductive cover layers 145 may be respectively arranged in the first pad openings 129 of the first insulating layer 120. The first conductive cover layers 145 may respectively correspond to barrier layers configured to prevent the first conductive pads 141 from being oxidized and/or damaged by covering the first conductive pads 141.

For example, the first conductive cover layers 145 may include or may be formed of Ni, gold (Au), palladium (Pd), or a combination thereof. For example, the first conductive cover layers 145 may be formed by an electroplating process.

The first main line pattern 150 may be on the first surface 1111 of the base insulating layer 111 and may extend along the first surface 1111 of the base insulating layer 111. For example, the first main line pattern 150 may linearly extend along the first surface 1111 of the base insulating layer 111 in a plan view. For example, the first main line pattern 150 may extend along a straight line extending in a first horizontal direction (e.g., the Y direction). The first main line pattern 150 may be in the second region R2 of the package substrate 10 between two adjacent first regions R1 of the package substrate 10. In example embodiments, the first main line pattern 150 may be in the scribe lane SL of the second region R2 of the package substrate 10 and may extend in the extension direction (e.g., the Y direction) of the scribe lane SL in the second region R2 of the package substrate 10. When the first main line pattern 150 is in the scribe lane SL, the first main line pattern 150 may be removed when a cutting process is performed on the package substrate 10. The first main line pattern 150 may include or may be formed of a conductive material. For example, the material of the first main line pattern 150 may be substantially the same as or similar to that of the first conductive pads 141 described above. The present invention, however, is not limited thereto. In an embodiment, the first main line pattern 150 may include a portion extending in the X direction and a portion extending in the Y direction.

A horizontal width W1 of the first main line pattern 150 may be substantially uniform. In example embodiments, the horizontal width W1 of the first main line pattern 150 may be about 15 micrometers (μm) to about 150 μm or about 30 μm to about 100 μm.

The first branch line patterns 160 may extend between the first main line pattern 150 and the first conductive pads 141. A first end of each of the first branch line patterns 160 may be in contact with the first main line pattern 150, and a second end of each of the first branch line patterns 160 may be connected to a corresponding one of the first conductive pads 141. In a plan view, each of the first branch line patterns 160 may have a line shape extending from the first main line pattern 150 to a corresponding one of the first conductive pads 141. In example embodiments, the first main line pattern 150 and the first branch line patterns 160 may be used as a path, through which electric power is supplied during an electroplating process performed to form the first conductive cover layers 145. The first branch line patterns 160 may include or may be formed of a conductive material. For example, the material of the first branch line patterns 160 may be substantially the same as or similar to that of the first main line pattern 150 and/or that of the first conductive pads 141.

A horizontal width W2 of each of the first branch line patterns 160 may be substantially uniform. In example embodiments, the horizontal width W2 of each of the first branch line patterns 160 may be substantially the same as or similar to the horizontal width W1 of the first main line pattern 150. In example embodiments, the horizontal width W2 of each of the first branch line patterns 160 may be about 15 μm to about 150 μm or about 30 μm to about 100 μm.

As shown in FIG. 3, when the first main line pattern 150 extends in a first horizontal direction (e.g., the Y direction), contact points between the first branch line patterns 160 and the first main line pattern 150 may be spaced apart from each other in the first horizontal direction (e.g., the Y direction). As shown in FIG. 3, some of the first branch line patterns 160 may be connected to first conductive pads 141 in a first region R1 of the package substrate 10, which is at one side (e.g., on the left) of the first main line pattern 150, and some of the first branch line patterns 160 may be connected to first conductive pads 141 in a first region R1 of the package substrate 10, which is at an opposite side (e.g., on the right) of the first main line pattern 150.

In a plan view, the first insulating layer 120 may include a plurality of first through grooves 121, which respectively overlap extension paths of the first branch line patterns 160 in a plan view. For example, each of the first branch line patterns 160 may include a first segment 161 and a second segment 163 which are separately from each other by a cut portion 165 (i.e., a gap between the first segment 161 and the second segment 163), and the first segment 161 and the second segment 163 may be arranged along a straight line extending in a second horizontal direction (e.g., the X direction). In each first branch line pattern, an extension path may extend along the straight line, and when viewed in a plan view, a corresponding first through groove may be disposed at the extension path. The first through grooves 121 may be adjacent to the scribe lane SL and spaced apart from the first main line pattern 150 in a lateral direction (e.g., the X direction). The first through grooves 121 may pass through the first insulating layer 120 in the vertical direction (e.g., the Z direction). A portion of the first surface 1111 of the base insulating layer 111 may be exposed by each of the first through grooves 121. In an embodiment, each of the first through grooves 121 may be connected to a corresponding cut portion of the cut portions 165 to expose the base insulating layer 111. As shown in FIG. 2, each of the first through grooves 121 may have a rectangular shape in a plan view. The present invention is not limited thereto. In an embodiment, each of the first through grooves 121 may have a polygonal shape, such as a pentagonal shape and a circular shape.

Each of the first through grooves 121 may have a first horizontal width L1 in the first horizontal direction (e.g., the Y direction), which is the extension direction of the first main line pattern 150, and a second horizontal width L2 in a second horizontal direction (e.g., the X direction), which is perpendicular to the first horizontal direction. In example embodiments, the first horizontal width L1 of each of the first through grooves 121 may be greater than the horizontal width W2 of each of the first branch line patterns 160. In example embodiments, the first horizontal width L1 of each of the first through grooves 121 may be about 80 μm to about 12 millimeters (mm). In example embodiments, the second horizontal width L2 of each of the first through grooves 121 may be about 80 μm to about 400 μm.

In example embodiments, a distance D1 between two first through grooves 121, which are nearest to each other in the first horizontal direction (e.g., the Y direction) among the first through grooves 121, may be less than or equal to 12 mm. Here, the two first through grooves 121 adjacent to each other in a diagonal direction (e.g., a direction between the X direction and the Y direction) among the first through grooves 121 may refer to two first through grooves 121 that have a shortest distance therebetween in the first horizontal direction (e.g., the Y direction) in a plan view among the first through grooves 121. In some embodiments, when viewed in a plan view, two first through grooves 121 most adjacent to each other in the first horizontal direction (e.g., the Y direction) may partially overlap each other in the second horizontal direction (e.g., the X direction).

In example embodiments, each of the first through grooves 121 may partially overlap the scribe lane SL when viewed in a plan view. In other words, a portion of each of the first through grooves 121 may be inside the scribe lane SL, and the other portion thereof may be outside the scribe lane SL. When a portion of the package substrate 10, which corresponds to the scribe lane SL, is removed by performing a cutting process on the package substrate 10, the first through grooves 121 may be exposed at a cut surface.

Each of the first branch line patterns 160 may include the first segment 161 and the second segment 163, which are spaced apart from each other by the first cut portion 165 therebetween. Because each of the first branch line patterns 160 has the first cut portion 165, each of the first branch line patterns 160 may have a line shape that discretely extends. For example, in each first branch line pattern, the first segment 161, the first cut portion 165, and the second segment 163 may be arranged along a straight line extending in the X direction, and the cut portion 165 may be disposed between the first segment 161 and the second segment 163. The first segment 161 may be connected to the first main line pattern 150, and the second segment 163 may be connected to a corresponding one of the first conductive pads 141. The first through grooves 121 of the first insulating layer 120 may respectively overlap first cut portions 165 of the first branch line patterns 160. For example, the first cut portion 165 of each of the first branch line patterns 160 may overlap a corresponding one of the first through grooves 121. For example, to respectively form the first cut portions 165 in the first branch line patterns 160, a plurality of conductive line patterns constituting the first branch line patterns 160 may be formed, and then portions of the conductive line patterns, which are exposed by the first through grooves 121 of the first insulating layer 120, may be removed by an etching process.

As shown in FIG. 3, the first through grooves 121 may be arranged in the first horizontal direction (e.g., the Y direction) and may be arranged asymmetrically or in zigzag in a plan view. In example embodiments, two first through grooves 121 adjacent to each other in the first horizontal direction (e.g., the Y direction) may be offset from each other in the first horizontal direction (e.g., the Y direction) and the second horizontal direction (e.g., the X direction). At this time, the two first through grooves 121 adjacent to each other in a diagonal direction (i.e., a direction between the X direction and the Y direction) may be spaced apart from each other by the first main line pattern 150 therebetween.

FIGS. 4A to 4E are cross-sectional views of stages in a method of manufacturing the package substrate 10, according to example embodiments. The method of manufacturing the package substrate 10, described above with reference to FIGS. 1 to 3, is described below with reference to FIGS. 4A to 4E.

Figure 4A:
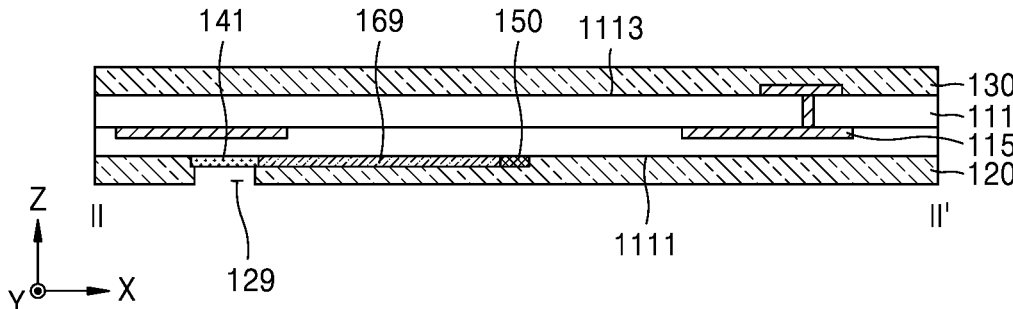
FIGS. 4A to 4E are cross-sectional views of stages in a method of manufacturing a package substrate, according to example embodiments.

Referring to FIG. 4A, a structure having a panel shape may be prepared. The structure may include the base insulating layer 111, the first insulating layer 120, the second insulating layer 130, the internal interconnect structure 115, the first conductive pads 141, the first main line pattern 150, and a plurality of first preliminary branch line patterns 169.

Figure 4B:
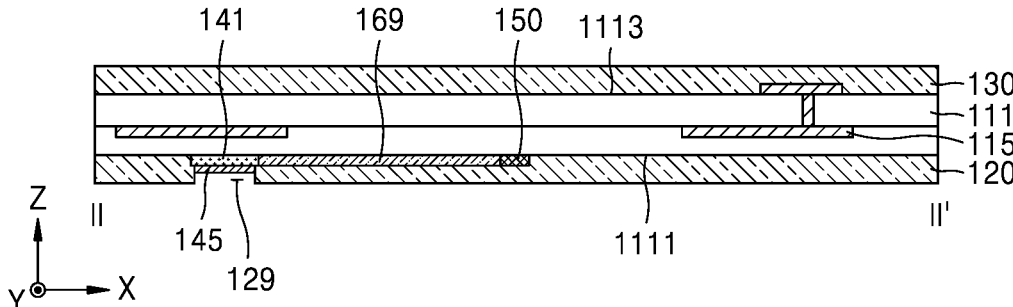

Referring to FIG. 4B, the first conductive cover layers 145 may be respectively formed on the first conductive pads 141. The first conductive cover layers 145 may be formed to respectively cover the surfaces of the first conductive pads 141, which are respectively exposed by the first pad openings 129 of the first insulating layer 120. The first conductive cover layers 145 may be formed by an electroplating process. When the electroplating process is performed, electrical power for electroplating may be supplied to the first conductive pads 141 through an electrical connection path passing through the first main line pattern 150 and the first preliminary branch line patterns 169.

Figure 4C:
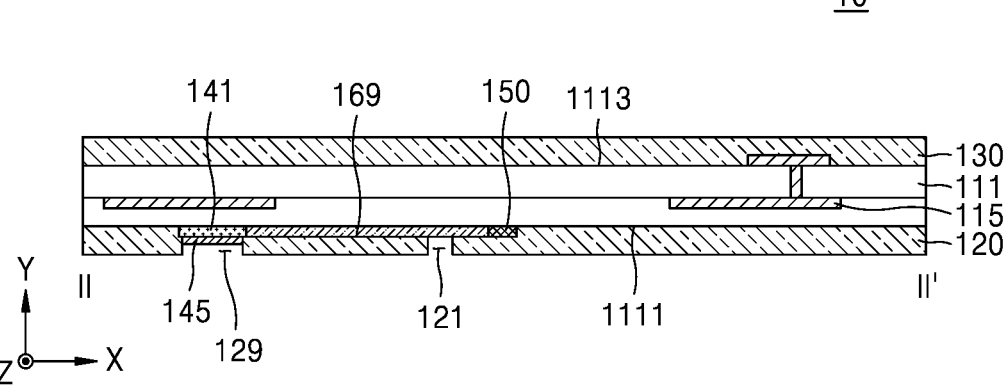

Referring to FIG. 4C, the first through grooves 121, which expose the first preliminary branch line patterns 169, may be formed in the first insulating layer 120 by removing portions of the first insulating layer 120. For example, the first through grooves 121 may be formed in the first insulating layer 120 by laser drilling, etching, or the like.

Figure 4D:
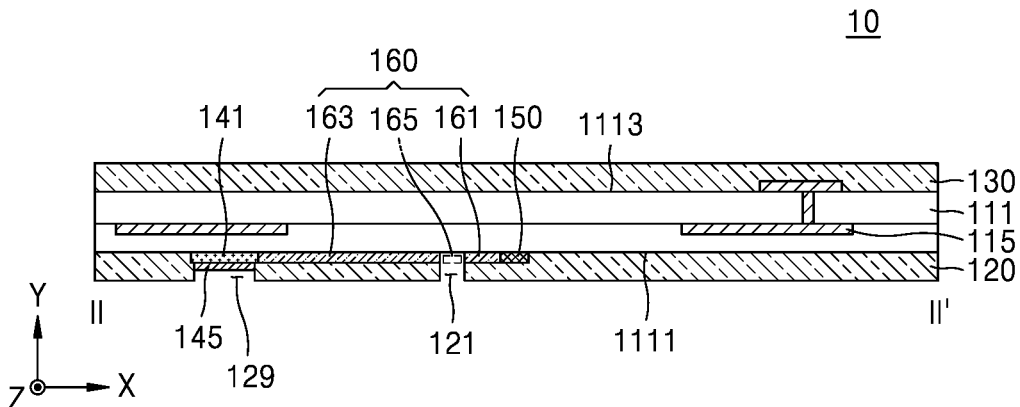

Referring to FIGS. 4C and 4D, the first branch line patterns 160 may be formed by removing portions of the first preliminary branch line patterns 169, which are exposed by the first through grooves 121. For example, the portions of the first preliminary branch line patterns 169, which are exposed by the first through grooves 121, may be removed by an etching process. When the portions of the first preliminary branch line patterns 169, which are exposed by the first through grooves 121, are removed, the first segment 161 of each of the first branch line patterns 160, which extends from the first main line pattern 150, may be spaced apart from the second segment 163 of each of the first branch line patterns 160, which extends from a corresponding one of the first conductive pads 141, by the first cut portion 165 (i.e., a gap between the first segment 161 and the second segment 163) of each of the first branch line patterns 160. For example, each of the first preliminary branch line pattern may be cut into the first segment 161 and the second segment 163 using an etching process, for example, and a gap between the first segment 161 and the second segment 163 may be referred to as the first cut portion 165. In the etching process, a portion of each first preliminary branch line pattern may be exposed, to an etchant or an etching gas, by a corresponding first through groove among the first through grooves 121.

Figure 4E:
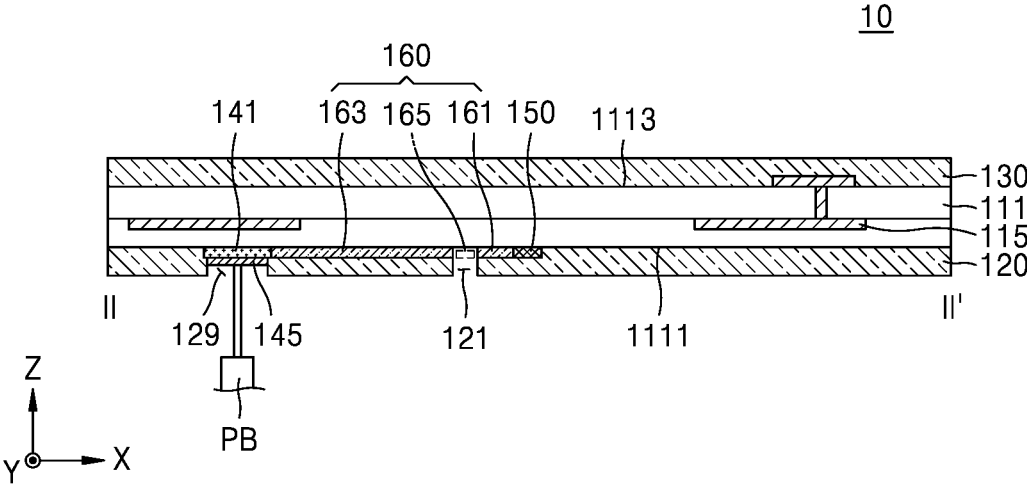

Referring to FIG. 4E, an electrical test may be performed on the package substrate 10. For example, a probe PB may contact at least one of the first conductive pads 141 to perform an electrical test on the package substrate 10. Because each of the first branch line patterns 160 has the first cut portion 165, the first conductive pads 141 in two adjacent first regions R1 (see, FIG. 3, for example) are not electrically connected with each other through the first branch line patterns 160 and the first main line pattern 150. Because the first conductive pads 141 are not electrically connected to each other through the first branch line patterns 160 and the first main line pattern 150, the probe PB may contact the first conductive pads 141 to perform an electrical test on the package substrate 10. In an embodiment, the electrical test may include performing an electrical open/short test on the internal interconnect structure 115 in each first region R1. In the electrical open/short test, it is tested whether the internal interconnect structure 115 has a broken line or electrical short between two interconnect lines. In an embodiment, when a semiconductor chip is mounted on the first region R1, the electrical open/short test may be performed to verify whether the semiconductor chip has a proper connection with the package substrate 10.

FIGS. 5A to 5H are respectively bottom views of package substrates 11, 12, 13, 14, 15, 16, 17, and 18 according to example embodiments. The package substrates 11, 12, 13, 14, 15, 16, 17, and 18 of FIGS. 5A to 5H are described below, focusing on the differences from the package substrate 10 described above with reference to FIGS. 1 to 3.

Figure 5A:
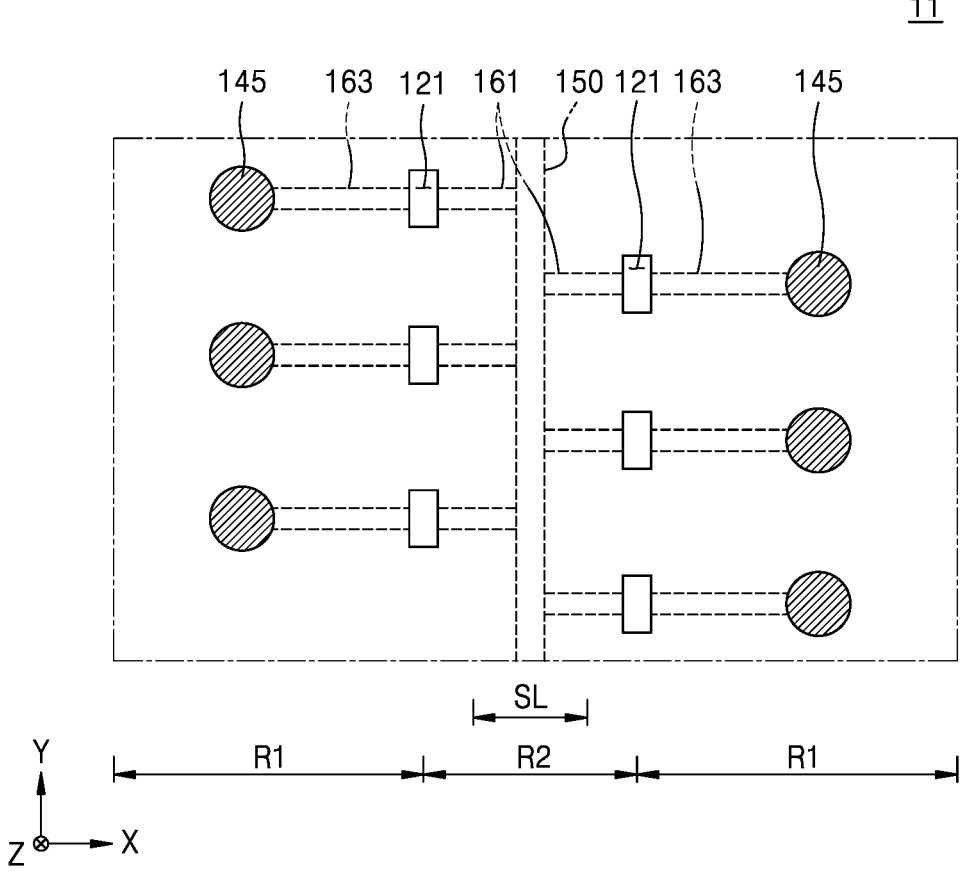
FIGS. 5A to 5H are respectively bottom views of package substrates according to example embodiments.

Referring to FIG. 5A, the first through grooves 121 may be outside the scribe lane SL. When a cutting process is performed on the package substrate 11, the first through grooves 121 outside the scribe lane SL may not be removed but remain in the first insulating layer 120 even after the cutting process.

Figure 5B:
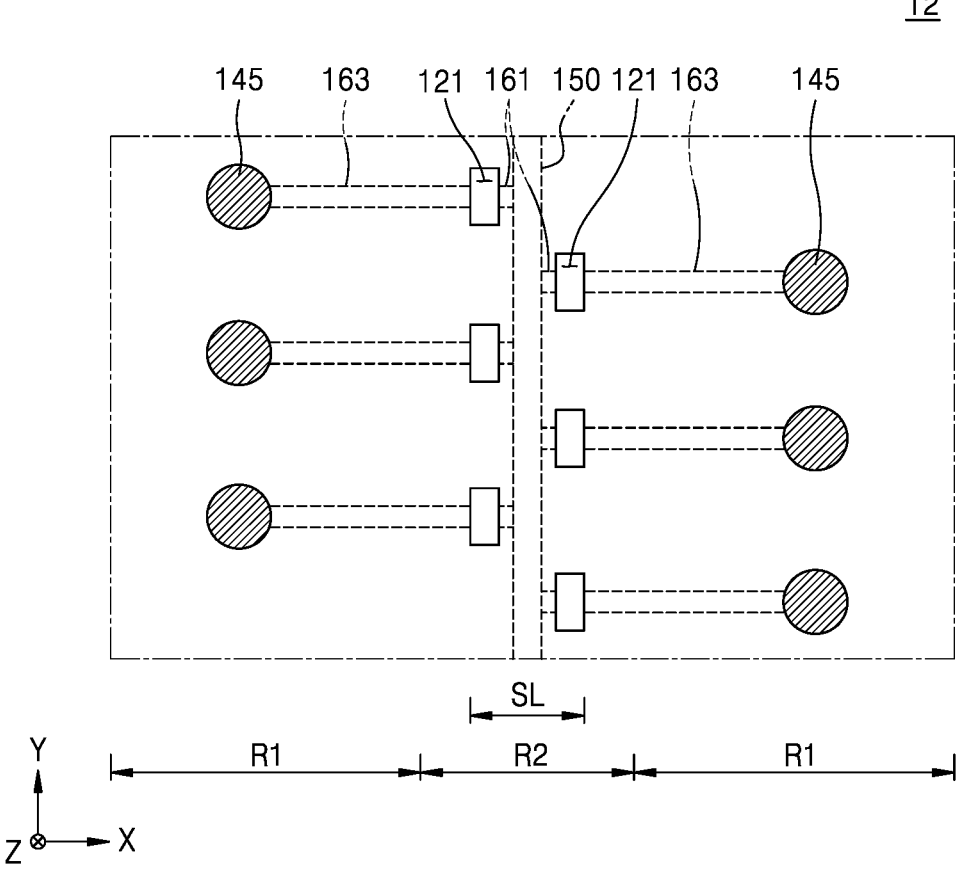

Referring to FIG. 5B, each of the first through grooves 121 may be completely inside the scribe lane SL. In other words, in a plan view, the entirety of each of the first through grooves 121 may overlap the scribe lane SL. The first through grooves 121 inside the scribe lane SL may be removed by a cutting process performed on the package substrate 12.

Figure 5C:
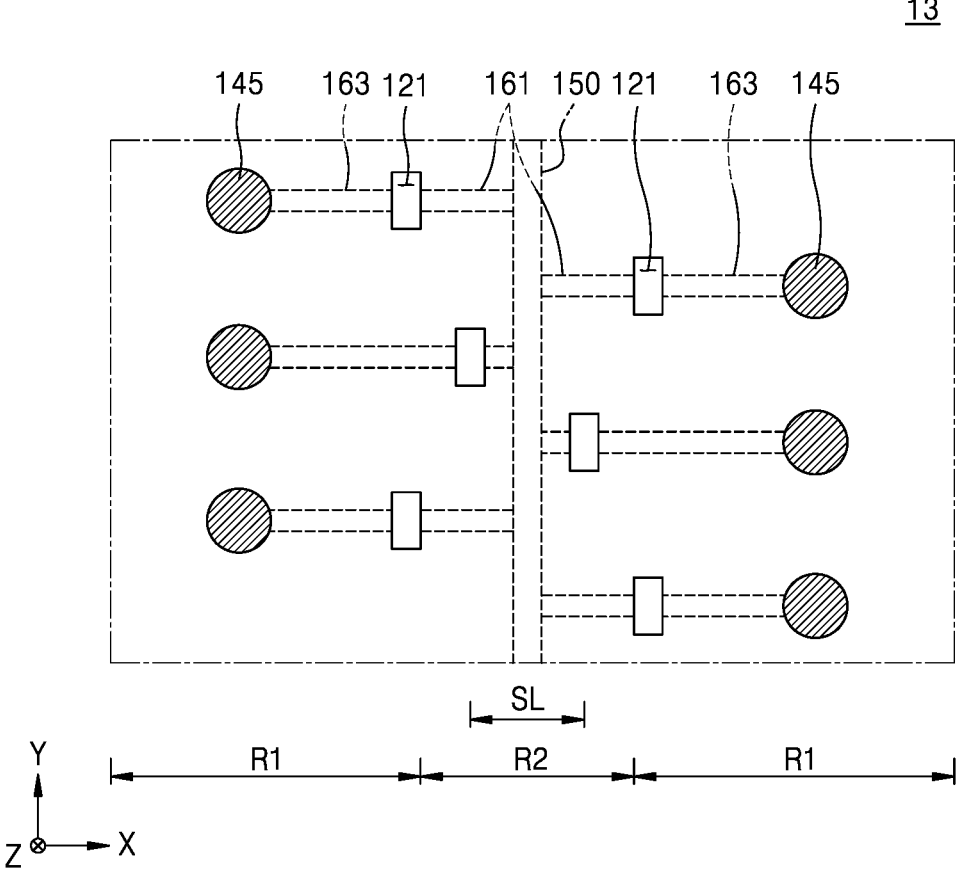

Referring to FIG. 5C, first through grooves 121 at one side (e.g., on the left) of the first main line pattern 150 may be arranged asymmetrically or in zigzag, and first through grooves 121 at an opposite side (e.g., on the right) of the first main line pattern 150 may be arranged asymmetrically or in zigzag. In other words, some of the first through grooves 121 at one side of the first main line pattern 150 may be offset from each other in the second horizontal direction (e.g., the X direction), and some of the first through grooves 121 at the opposite side of the first main line pattern 150 may be offset from each other in the second horizontal direction (e.g., the X direction).

In example embodiments, at least one of the first through grooves 121 at one side of the first main line pattern 150 may at least partially overlap the scribe lane SL, and at least another one of the first through grooves 121 at one side of the first main line pattern 150 may be outside the scribe lane SL. At least one of the first through grooves 121 at the opposite side of the first main line pattern 150 may at least partially overlap the scribe lane SL, and at least another one of the first through grooves 121 at the opposite side of the first main line pattern 150 may be outside the scribe lane SL. When a portion of the package substrate 13, which corresponds to the scribe lane SL, is removed by performing a cutting process on the package substrate 13, the first through grooves 121 that at least partially overlap the scribe lane SL may be entirely or partially removed.

Figure 5D:
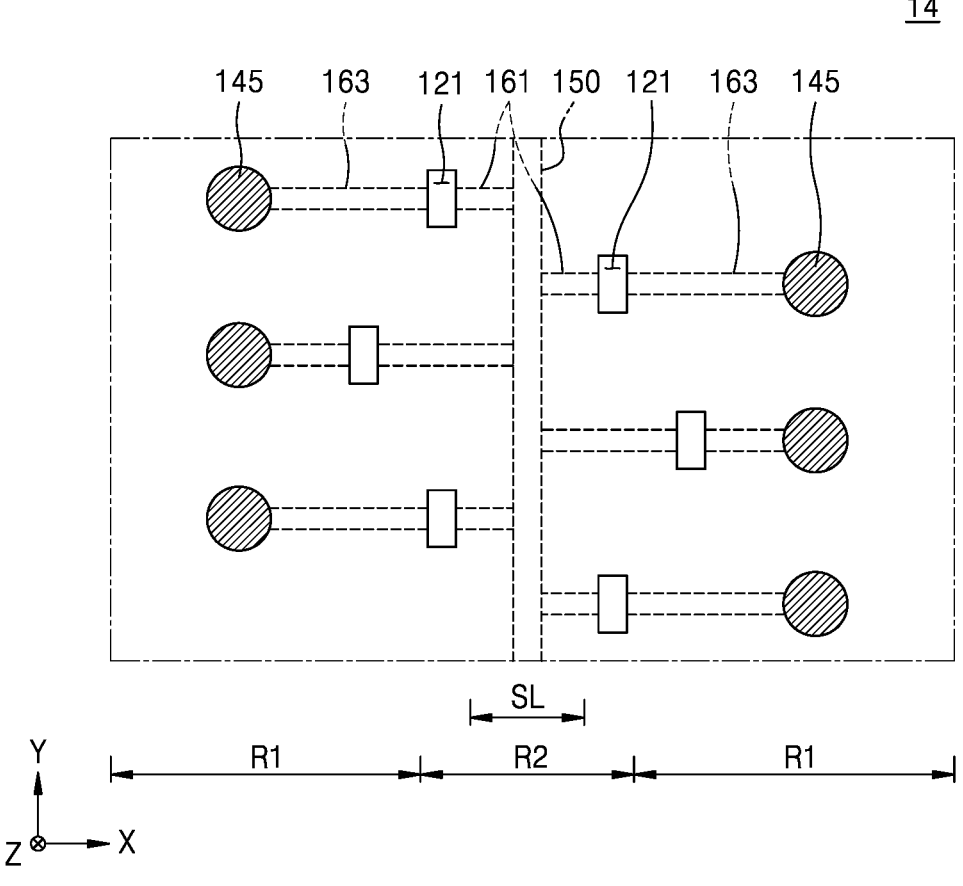

Referring to FIG. 5D, first through grooves 121 at one side (e.g., on the left) of the first main line pattern 150 may be arranged asymmetrically or in zigzag, and first through grooves 121 at an opposite side (e.g., on the right) of the first main line pattern 150 may be arranged asymmetrically or in zigzag. At this time, the first through grooves 121 at one side of the first main line pattern 150 and the first through grooves 121 at the opposite side of the first main line pattern 150 may all be outside the scribe lane SL. In this case, the first through grooves 121 outside the scribe lane SL may not be removed by a cutting process performed on the package substrate 14 but remain in the first insulating layer 120 even after the cutting process.

Figure 5E:
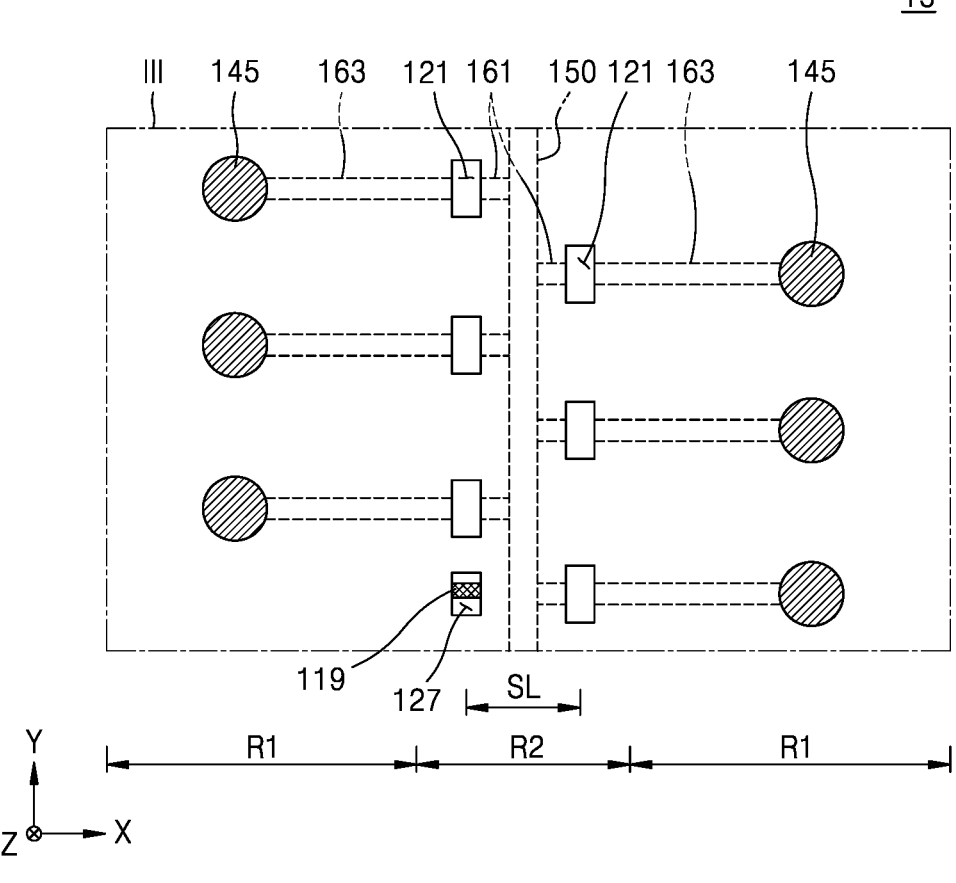

Referring to FIG. 5E, the first insulating layer 120 may have a groove 127 adjacent to the scribe lane SL, and the package substrate 15 may include a conductive pattern 119, which is exposed by the groove 127 of the first insulating layer 120. The conductive pattern 119 may be on the first surface 1111 (FIG. 2) of the base insulating layer 111 (FIG. 2). The conductive pattern 119 may be configured to transmit an input/output data signal, a power signal, and/or a ground signal, which are provided to the package substrate 15.

Figure 5F:
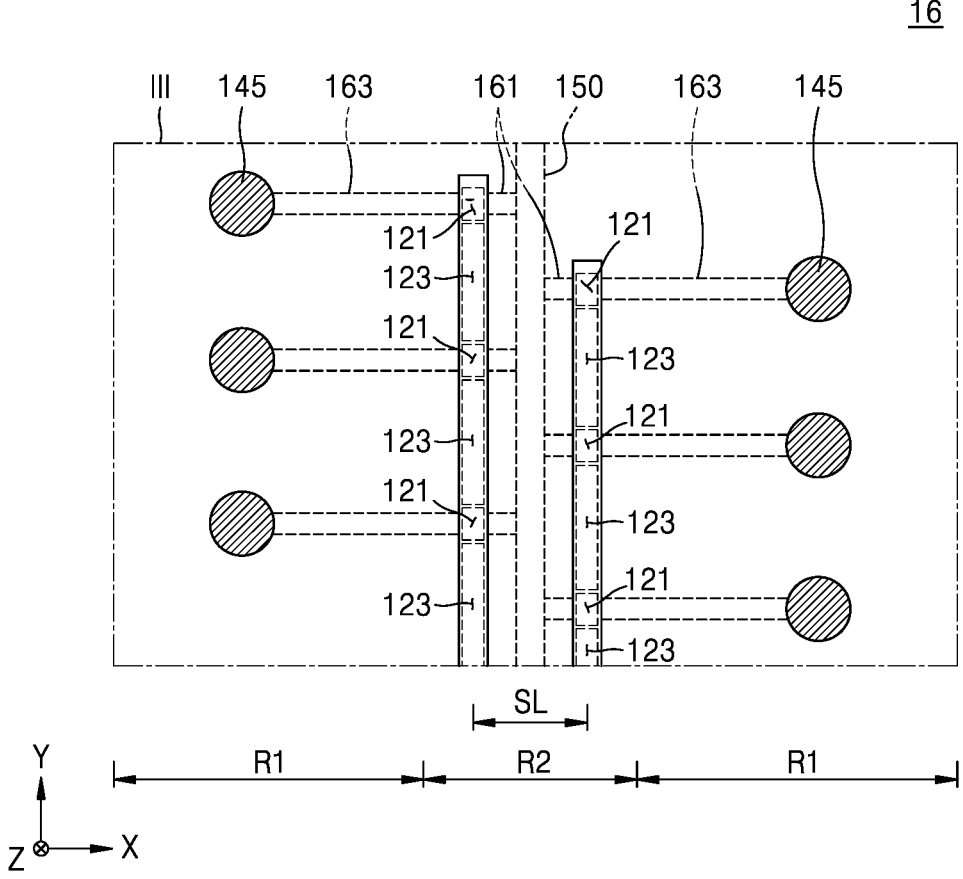

Referring to FIG. 5F, the first insulating layer 120 may include at least one bridge groove 123, which extends between some of the first through grooves 121. The bridge groove 123 may pass through the first insulating layer 120. A portion of the first surface 1111 of the base insulating layer 111 may be exposed by the bridge groove 123. For example, the bridge groove 123 may linearly extend when viewed in a plan view. For example, the bridge groove 123 may extend in a direction that is parallel with the extension direction of the first main line pattern 150. In an embodiment, the bridge groove 123 may extend along a straight line extending in the extension direction (e.g., the Y direction) of the first main line pattern 150.

In example embodiments, first through grooves 121 at one side (e.g., on the left) of the first main line pattern 150 may be connected to each other through bridge grooves 123, and first through grooves 121 at an opposite side (e.g., on the right) of the first main line pattern 150 may be connected to each other through bridge grooves 123. In this case, in a plan view, the first insulating layer 120 may include the bridge grooves 123 (e.g., trenches), which linearly extends in the direction parallel with the extension direction of the first main line pattern 150, as shown in FIG. 5F. In an embodiment, each of the bridge grooves 123 may extend along a straight line extending in the extension direction (e.g., the Y direction) of the first main line pattern 150.

In example embodiments, each of the first through grooves 121 and the bridge grooves 123 may partially overlap the scribe lane SL in a plan view. When a portion of the package substrate 16, which corresponds to the scribe lane SL, is removed by performing a cutting process on the package substrate 16, the first through grooves 121 and the bridge grooves 123 may be exposed at a cut surface.

Figure 5G:
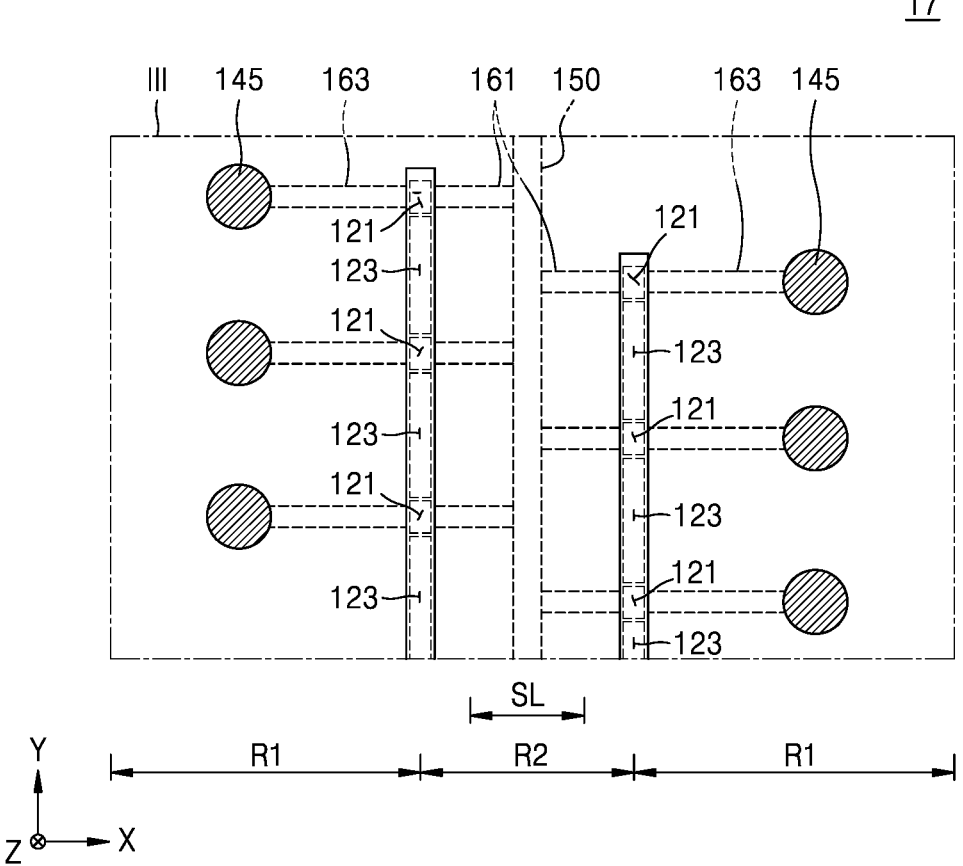

Referring to FIG. 5G, the first insulating layer 120 may further include at least one bridge groove 123, which extends between some of the first through grooves 121. A plurality of first through grooves 121 and a plurality of bridge grooves 123 may be outside the scribe lane SL. In this case, the first through grooves 121 and at least one bridge groove 123, which are outside the scribe lane SL, may not be removed by a cutting process performed on the package substrate 17 but remain inside the first insulating layer 120 even after the cutting process.

Figure 5H:
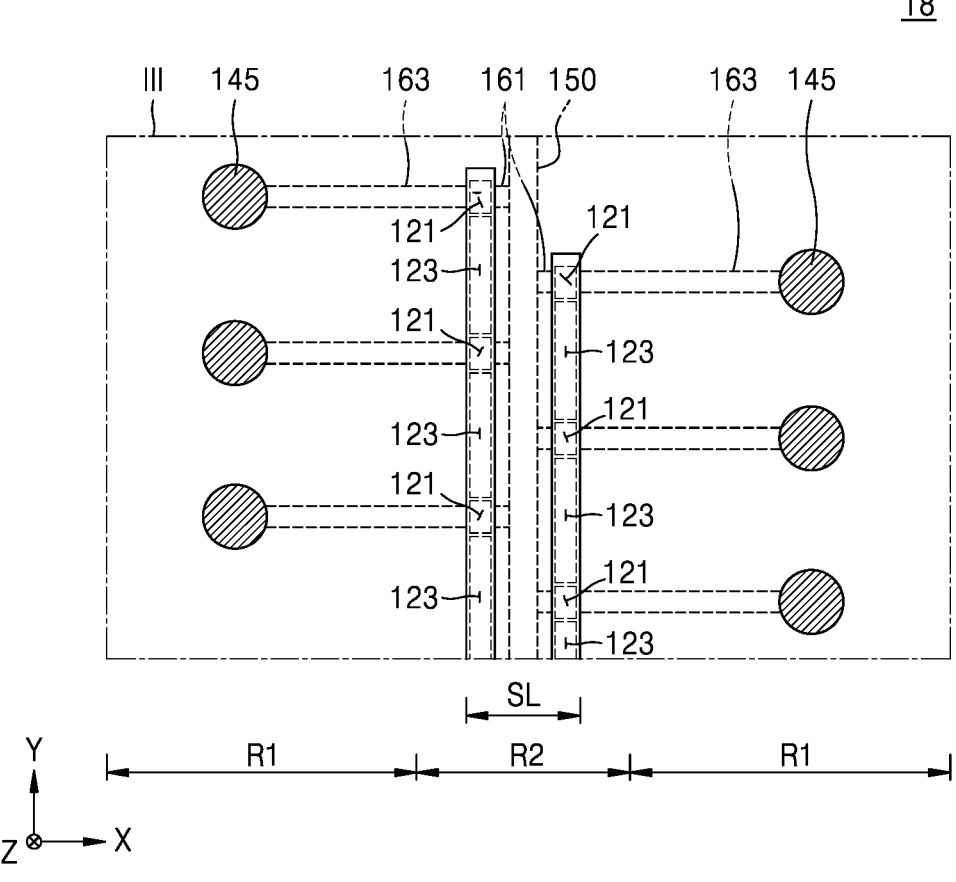

Referring to FIG. 5H, the first insulating layer 120 may further include at least one bridge groove 123, which extends between some of the first through grooves 121. The first through grooves 121 and the bridge groove 123 may be inside the scribe lane SL. In other words, in a plan view, the entirety of each of the first through grooves 121 and the bridge groove 123 may overlap the scribe lane SL. The first through grooves 121 and the bridge groove 123 inside the scribe lane SL may be removed by a cutting process performed on the package substrate 18.

Figure 6A:
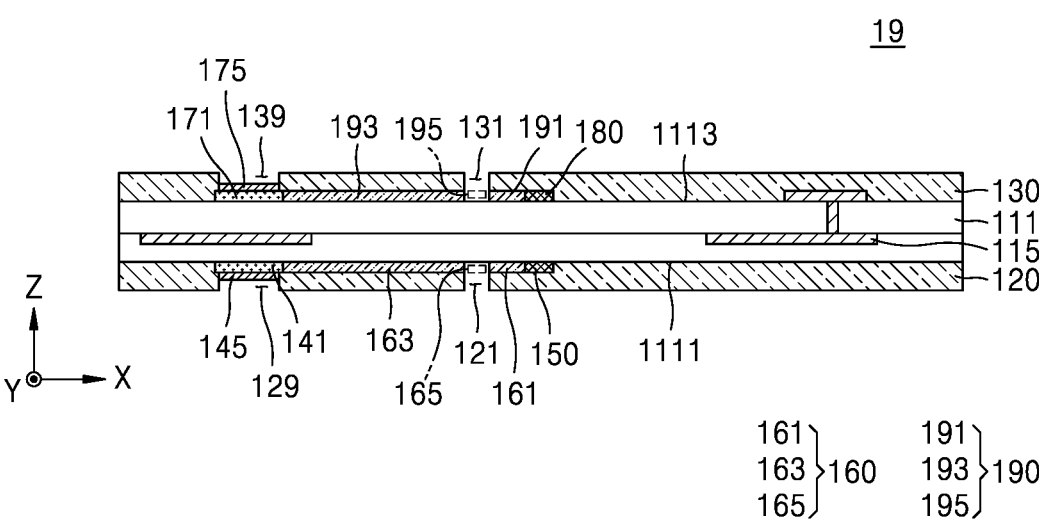
FIGS. 6A and 6B are respectively cross-sectional views of package substrates according to example embodiments.
Figure 6B:
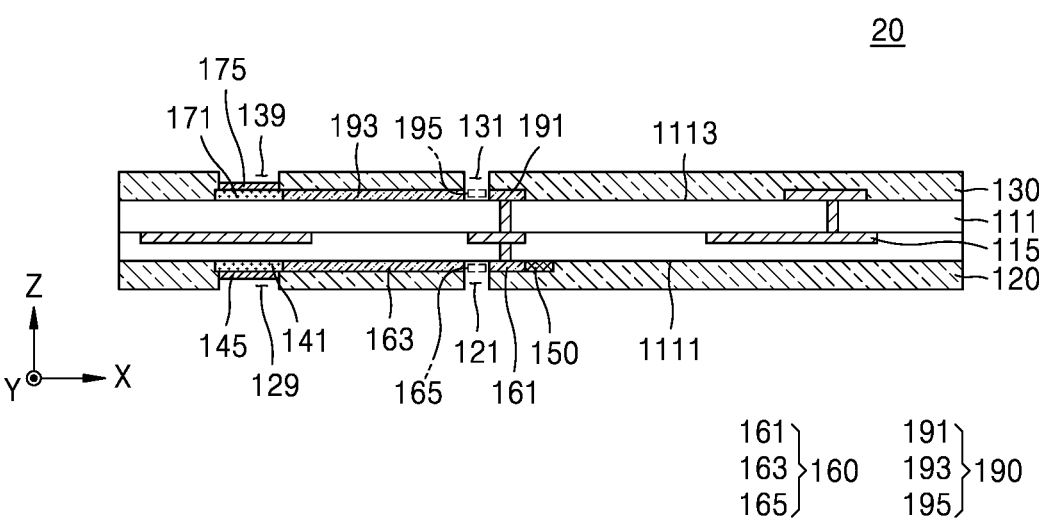

FIGS. 6A and 6B are respectively cross-sectional views of package substrates 19 and 20 according to example embodiments. The package substrates 19 and 20 of FIGS. 6A and 6B are described below, focusing on the differences from the package substrate 10 described above with reference to FIGS. 1 to 3.

Referring to FIG. 6A together with FIGS. 1 to 3, the package substrate 19 may include at least one second conductive pad 171, at least one second conductive cover layer 175, a second main line pattern 180, and at least one second branch line pattern 190.

The second conductive pad 171 may be on the second surface 1113 of the base insulating layer 111. The second conductive pad 171 may be located to overlap a second pad opening 139 of the second insulating layer 130. For example, the second pad opening 139 may expose the second conductive pad 171. The second conductive pad 171 may function as a pad, to which a connecting member (e.g., a conductive bump, a conductive wire, or a solder ball) for electrically and physically connecting the package substrate 19 to other electronic parts is attached. The second conductive pad 171 may be arranged in a first region R1 of the package substrate 19. For example, the material of the second conductive pad 171 may be the same as or similar to that of the first conductive pads 141.

The second conductive cover layer 175 may extend along the surface of the second conductive pad 171. The second conductive cover layer 175 may be arranged in the second pad opening 139 of the second insulating layer 130. The second conductive cover layer 175 may correspond to a barrier layer configured to prevent the second conductive pad 171 from being oxidized and/or damaged by covering the second conductive pad 171. For example, the material of the second conductive cover layer 175 may be the same as or similar to that of the first conductive cover layers 145.

The second main line pattern 180 may be on the second surface 1113 of the base insulating layer 111 and may extend along the second surface 1113 of the base insulating layer 111. For example, the second main line pattern 180 may linearly extend along the second surface 1113 of the base insulating layer 111 when viewed in a plan view. In an embodiment, the second main line pattern 180 may extend along a straight line extending in the Y-direction. The second main line pattern 180 may be in a second region R2 of the package substrate 19 between two adjacent first regions R1 of the package substrate 19. In example embodiments, the second main line pattern 180 may be in a scribe lane SL of the second region R2 of the package substrate 19 and may extend in the extension direction (e.g., the X direction and/or the Y direction) of the scribe lane SL in the second region R2 of the package substrate 19. When the second main line pattern 180 is in the scribe lane SL, the second main line pattern 180 may be removed when a cutting process is performed on the package substrate 19. For example, the material of the second main line pattern 180 may be the same as or similar to that of the first main line pattern 150. The dimensions (e.g., a horizontal width) of the second main line pattern 180 may be the same as or similar to those of the first main line pattern 150.

The second branch line pattern 190 may extend between the second main line pattern 180 and the second conductive pad 171. A first end of the second branch line pattern 190 may be in contact with the second main line pattern 180, and a second end of the second branch line pattern 190 may be connected to the second conductive pad 171. In a plan view, the second branch line pattern 190 may have a line shape extending from the second main line pattern 180 to the second conductive pad 171. In example embodiments, the second main line pattern 180 and the second branch line pattern 190 may be used as a path, through which electrical power is supplied during an electroplating process performed to form the second conductive cover layer 175. In other words, when the electroplating process is performed to form the second conductive cover layer 175, electrical power for electroplating may be supplied to the second conductive pad 171 through an electrical connection path passing through the second main line pattern 180 and the second branch line pattern 190. For example, the material of the second branch line pattern 190 may be the same as or similar to that of the first branch line patterns 160. The dimensions (e.g., a horizontal width) of the second branch line pattern 190 may be the same as or similar to those of the first branch line patterns 160.

In example embodiments, when the second main line pattern 180 extends in the first horizontal direction (e.g., the Y direction), a plurality of second branch line patterns 190 may be spaced apart from each other in the first horizontal direction (e.g., the Y direction). At this time, contact points between the second branch line patterns 190 and the second main line pattern 180 may be spaced apart from each other in the first horizontal direction (e.g., the Y direction). Like the first branch line patterns 160 in FIG. 3, some of the second branch line patterns 190 may be connected to second conductive pads 171 in a first region R1 of the package substrate 19, which is at one side (e.g., on the left) of the second main line pattern 180, and some of the second branch line patterns 190 may be connected to second conductive pads 171 in a first region R1 of the package substrate 19, which is at an opposite side (e.g., on the right) of the second main line pattern 180.

In a plan view, the second insulating layer 130 may include at least one second through groove 131, which overlaps the extension path of the at least one second branch line pattern 190 in a plan view. The second through groove 131 may be adjacent to the scribe lane SL and spaced apart from the second main line pattern 180 in a lateral direction. The second through groove 131 may be located to entirely or partially overlap the scribe lane SL. The present invention is not limited thereto. In an embodiment, the second through groove 131 may be located outside the scribe lane SL. The second through groove 131 may pass through the second insulating layer 130 in the vertical direction (e.g., the Z direction). A portion of the second surface 1113 of the base insulating layer 111 may be exposed by the second through groove 131. The shape and dimensions (e.g., a horizontal width) of the second through groove 131 may be the same as or similar to those of the first through grooves 121.

The second branch line pattern 190 may include a third segment 191 and a fourth segment 193, which are spaced apart from each other by a second cut portion 195 therebetween. Because the second branch line pattern 190 has the second cut portion 195, the second branch line pattern 190 may have a line shape that discretely extends. The third segment 191 may be connected to the second main line pattern 180, and the fourth segment 193 may be connected to the second conductive pad 171. The second through groove 131 of the second insulating layer 130 may overlap the second cut portion 195 of the second branch line pattern 190. For example, the second cut portion 195 of the second branch line pattern 190 may overlap the second through groove 131. For example, to form the second cut portion 195 in the second branch line pattern 190, a conductive line pattern constituting the second branch line pattern 190 may be formed, and then a portion of the conductive line pattern, which is exposed by the second through groove 131 of the second insulating layer 130, may be removed by an etching process.

In example embodiments, a plurality of second branch line patterns 190 may be on the second surface 1113 of the base insulating layer 111, and the second insulating layer 130 may include a plurality of second through grooves 131, which respectively overlap the extension paths of the second branch line patterns 190. The arrangement of the second through grooves 131 may be substantially the same as or similar to that of the first through grooves 121. For example, similar to the first through grooves 121 in FIG. 3, the second through grooves 131 may be arranged asymmetrically or in zigzag.

In example embodiments, the second insulating layer 130 may further include at least one bridge groove, which extends between some of the second through grooves 131. A portion of the second surface 1113 of the base insulating layer 111 may be exposed by the bridge groove of the second insulating layer 130. For example, the bridge groove of the second insulating layer 130 may linearly extend when viewed in a plan view. For example, the bridge groove of the second insulating layer 130 may extend along a straight line extending in the Y-direction. The shape and arrangement of the bridge groove of the second insulating layer 130 may be similar to those of the bridge groove 123 of the first insulating layer 120, which has been described with reference to FIGS. 5F, 5G, and 5H.

Referring to FIG. 6B, the second branch line pattern 190 may be connected to one of the first branch line patterns 160 through the internal interconnect structure 115. When an electroplating process is performed to form the second conductive cover layer 175, electrical power for electroplating may be supplied to the second conductive pad 171 through an electrical connection path passing through the first main line pattern 150, a first branch line pattern 160, the internal interconnect structure 115, and the second branch line pattern 190. In this case, the second main line pattern 180 in FIG. 6A may be omitted.

Figure 7:
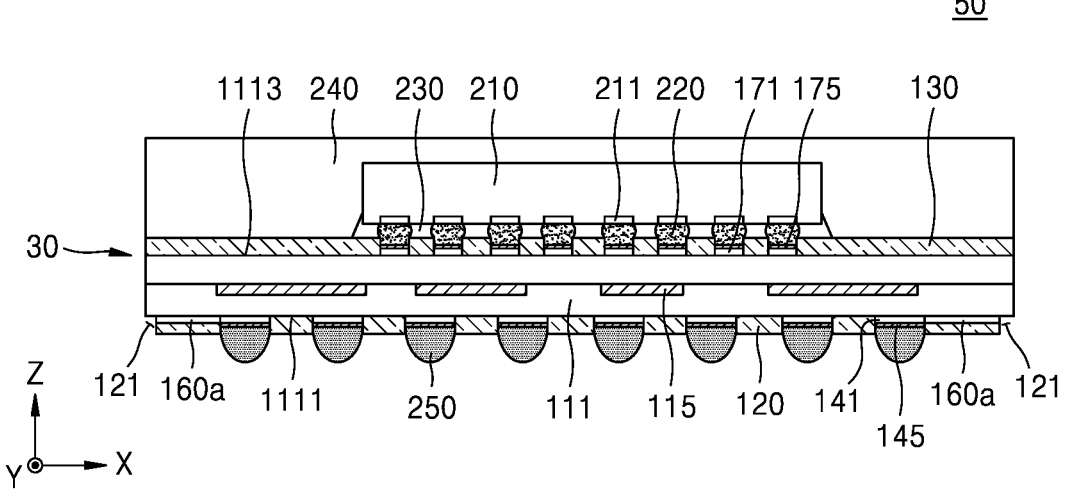
FIG. 7 is a cross-sectional view of a semiconductor package according to example embodiments.
Figure 8:
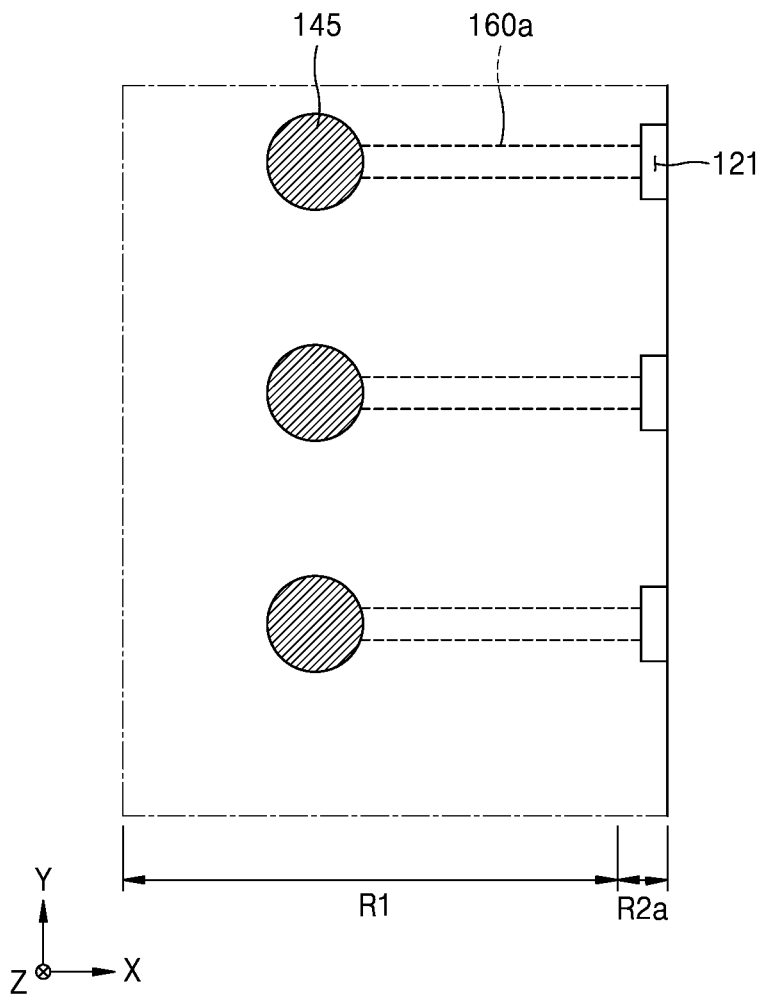
FIG. 8 is a bottom view of a portion of the semiconductor package of FIG. 7.

FIG. 7 is a cross-sectional view of a semiconductor package 50 according to example embodiments. FIG. 8 is a bottom view of a portion of the semiconductor package 50 of FIG. 7.

Referring to FIGS. 7 and 8, the semiconductor package 50 may include a package substrate 30, a semiconductor chip 210, a chip connection bump 220, an underfill layer 230, a molding layer 240, and an external connector 250.

For example, the package substrate 30 may correspond to a printed circuit board. The package substrate 30 may include the base insulating layer 111, the first insulating layer 120, the second insulating layer 130, the internal interconnect structure 115, a plurality of first conductive pads 141, a plurality of first conductive cover layers 145, the first main line pattern 150, a plurality of first branch line patterns 160a, a plurality of second conductive pads 171, and a plurality of second conductive cover layers 175. For example, the package substrate 30 may be a structure obtained through a cutting process, in which one of the package substrates 10, 11, 12, 13, 14, 15, 16, 17, 18, 19, and 20 described above with reference to FIGS. 1 to 6B is cut along the scribe lane SL. A first region R1 of the package substrate 30 may correspond to a first region R1 of one of the package substrates 10, 11, 12, 13, 14, 15, 16, 17, 18, 19, and 20 described above with reference to FIGS. 1 to 6B, and a second region R2a may correspond to a result of removing the scribe lane SL from a second region R2 of one of the package substrates 10, 11, 12, 13, 14, 15, 16, 17, 18, 19, and 20 described above with reference to FIGS. 1 to 6B.

As shown in FIGS. 7 and 8, a plurality of first through grooves 121 may be at an edge of the first insulating layer 120. The first through grooves 121 may be spaced apart from each other along the edge of the first insulating layer 120 or a side surface of the package substrate 30. The first through grooves 121 may be exposed at the side surface of the package substrate 30 to the outside of the package substrate 30. Ends of the first branch line patterns 160a, which are connected to the first through grooves 121, may be exposed to the outside of the package substrate 30 or the first insulating layer 120. For example, the package substrate 30 may be a structure, which is obtained by cutting the package substrate 10 of FIG. 3 or a package substrate similar to the package substrate 10 along the scribe lane SL.

The semiconductor chip 210 may be mounted on the package substrate 30. For example, the semiconductor chip 210 may be mounted on the package substrate 30 in a face-down manner. The chip connection bump 220 may be between a second conductive pad 171 of the package substrate 30 and a chip pad 211 of the semiconductor chip 210. The chip pad 211 is on the bottom surface of the semiconductor chip 210. The chip connection bump 220 may be configured to electrically connect the semiconductor chip 210 to the package substrate 30. For example, the chip connection bump 220 may include or may be formed of solder.

In example embodiments, the semiconductor chip 210 may include a memory chip. The semiconductor chip 210 may include or may be a volatile memory chip and/or a non-volatile memory chip. For example, the volatile memory chip may include or may be dynamic random access memory (DRAM), static RAM (SRAM), thyristor RAM (TRAM), zero capacitor RAM (ZRAM), or twin transistor RAM (TTRAM). For example, the non-volatile memory chip may include or may be flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory. In example embodiments, the semiconductor chip 210 may include a logic chip. For example, the logic chip may include an artificial intelligence semiconductor, a microprocessor, a graphics processor, a signal processor, a network processor, a chip set, an audio codec, a video codec, or an application processor.

The underfill layer 230 may be between the semiconductor chip 210 and the package substrate 30 and may surround the chip connection bump 220. The underfill layer 230 may be formed to fill a gap between the semiconductor chip 210 and the package substrate 30 by using a capillary underfill process.

The molding layer 240 may be on the package substrate 30 and may cover at least a portion of the semiconductor chip 210. The molding layer 240 may include or may be formed of an epoxy mold compound (EMC) or a photosensitive material, such as photoimagable encapsulant (PIE).

The external connector 250 may be connected to a first conductive pad 141 of the package substrate 30. The external connector 250 may electrically and physically connect the semiconductor package 50 to an external device, on which the semiconductor package 50 is mounted. The external connector 250 may include or may be a solder ball or a solder bump.

Figure 9A:
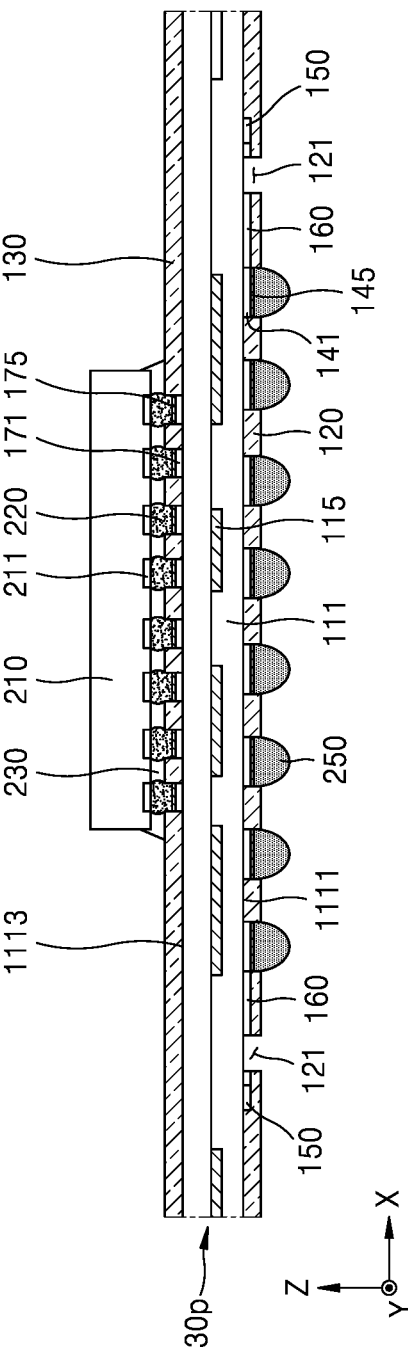
FIGS. 9A to 9C are cross-sectional views of stages in a method of manufacturing a semiconductor package, according to example embodiments.
Figure 9B:
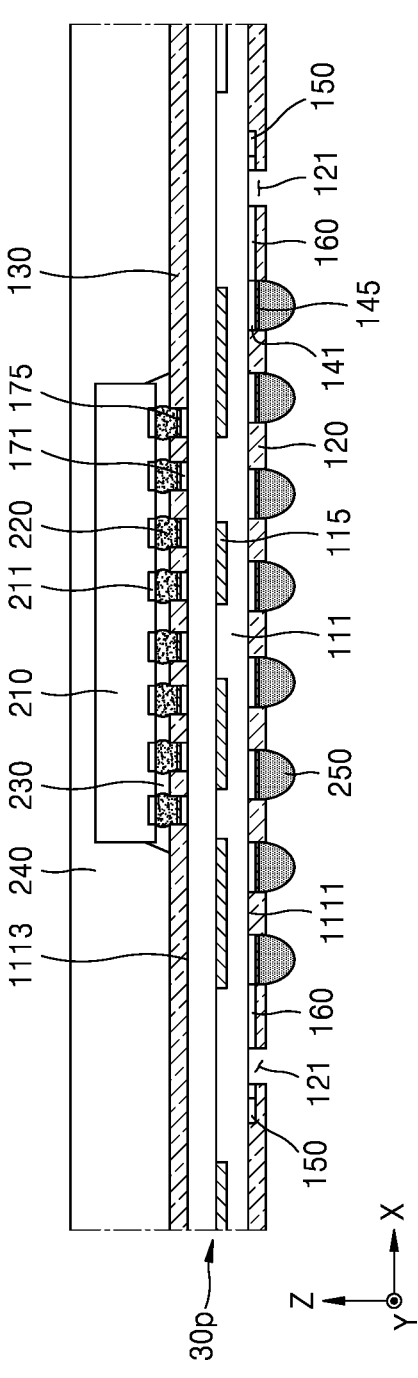
Figure 9C:
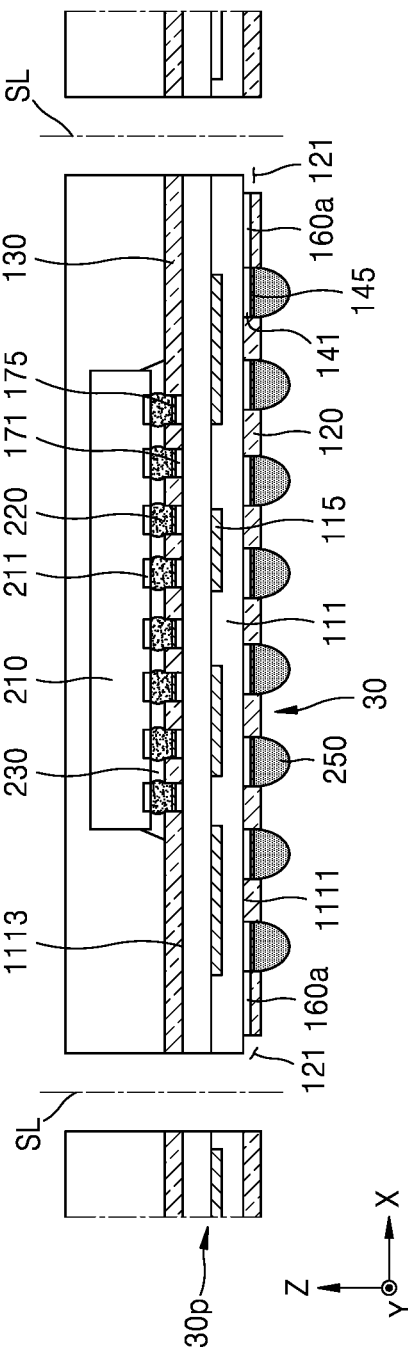

FIGS. 9A to 9C are cross-sectional views of stages in a method of manufacturing the semiconductor package 50, according to example embodiments. The method of manufacturing the semiconductor package 50, described above with reference to FIGS. 7 and 8, is described below with reference to FIGS. 9A to 9C.

Referring to FIG. 9A, a preliminary package substrate 30p may be prepared. The preliminary package substrate 30p may be a panel-shaped structure including a plurality of first regions R1, which are spaced apart from each other by the second region R2 including the scribe lane SL, like the package substrate 10 of FIG. 1.

After the preliminary package substrate 30p is prepared, the semiconductor chip 210 may be mounted on the preliminary package substrate 30p. The semiconductor chip 210 may be attached to the preliminary package substrate 30p through the chip connection bump 220. Although it is illustrated in FIG. 9A that one semiconductor chip 210 is mounted on the preliminary package substrate 30p, a plurality of semiconductor chips 210 may be mounted on the preliminary package substrate 30p. After the semiconductor chip 210 is mounted on the preliminary package substrate 30p, an underfill process may be performed to form the underfill layer 230 filling a gap between the semiconductor chip 210 and the preliminary package substrate 30p.

Referring to FIG. 9B, after the underfill layer 230 is formed, the molding layer 240 covering the semiconductor chip 210 may be formed on the preliminary package substrate 30p.

Referring to FIG. 9C, a cutting process may be performed to cut the resultant structure of FIG. 9B along the scribe lane SL. The cutting process may include a cutting process using a sawing blade and/or a cutting process using a laser beam. When the resultant structure of FIG. 9B is cut along the scribe lane SL, the preliminary package substrate 30p may be separated into a plurality of individualized package substrates 30. A portion of each of a plurality of first through grooves 121, which is in the scribe lane SL, may be removed by the cutting process. The other portion of each of the first through grooves 121, which remains after the cutting process, may be exposed in a lateral direction on a cut surface (i.e., a side surface of the semiconductor package 50) formed by the cutting process.

As described above, to perform an electrical test on a package substrate during the manufacture of the package substrate, a cut portion needs to be formed in each of branch line patterns, which is used for an electroplating process, before the electrical test. To form a cut portion in each of the branch line patterns, a groove having the same width as a scribe lane (see SL in FIG. 1) of the package substrate may be formed in an insulating layer covering the branch line patterns, and then a portion of each branch line pattern may be removed. However, when the groove of the insulating layer has a broad width similar to the width of the scribe lane, there may be problems, such as damage to the package substrate near the groove of the insulating layer and damage to an interconnect in the package substrate, during a process, e.g., a molding process, in which a relatively high pressure is applied to the package substrate. In an embodiment, electrical test such an electrical open/short test, may be performed after the preparation of the preliminary package substrate 30p to verify whether the internal interconnect structure 115 has a broken line or electrical short between two interconnect lines, or between the mounting of the semiconductor chip 210 and the forming of the molding layer 240 to verify whether the semiconductor chip 210 is properly connected to the preliminary package substrate 30p. The present invention is not limited thereto. In an embodiment, the electrical open/short test may be performed on individualized package substrates separated from the preliminary package substrate 30p.

However, according to example embodiments, each of the first through grooves 121 of the first insulating layer 120 is located to overlap a corresponding one of the first branch line patterns 160, and accordingly, the first through grooves 121 each required to form the first cut portion 165 in a corresponding one of the first branch line patterns 160 may be formed in a relatively small size. Furthermore, because the first through grooves 121 are formed asymmetrically or in zigzag, stress may be prevented from concentrating on a certain portion of the package substrate 10. According to example embodiments, therefore, damage to the package substrate 30 may be prevented, and the reliability of the package substrate 30 and the reliability of the semiconductor package 50 manufactured using the package substrate 30 may be increased.

Figure 10A:
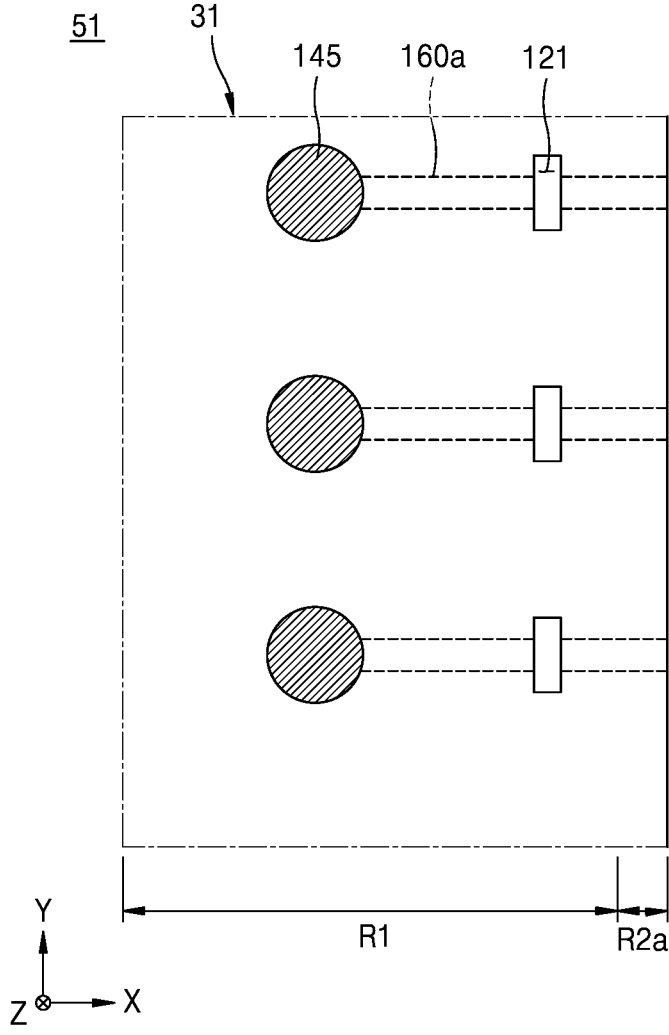
FIGS. 10A to 10F are respectively bottom views of semiconductor packages according to example embodiments.
Figure 10B:
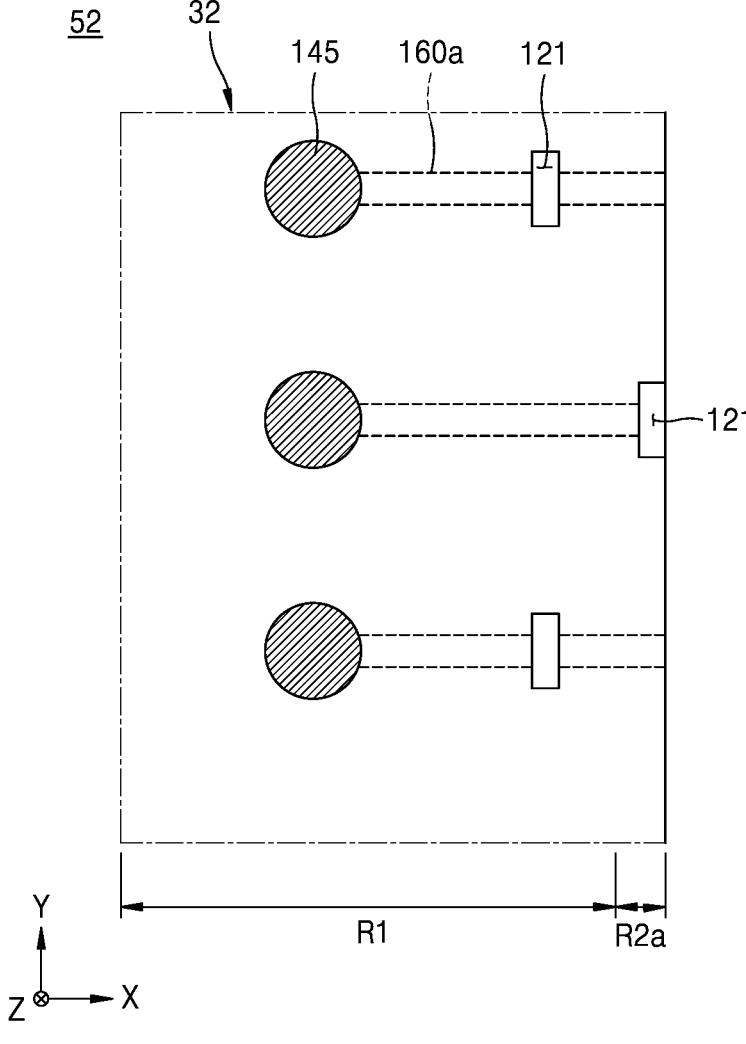
Figure 10C:
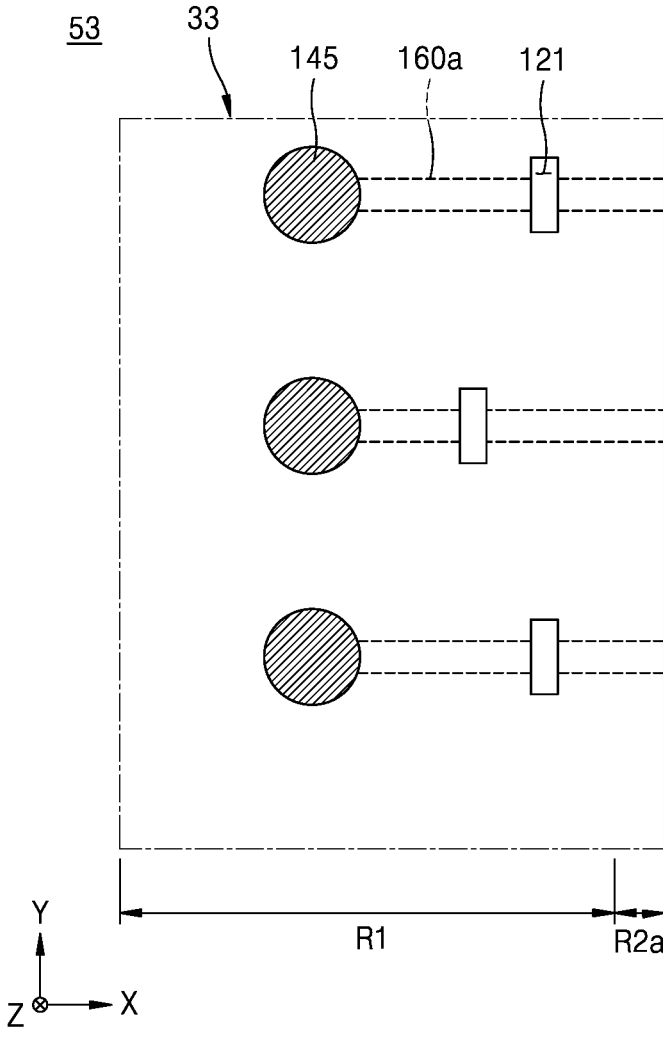
Figure 10D:
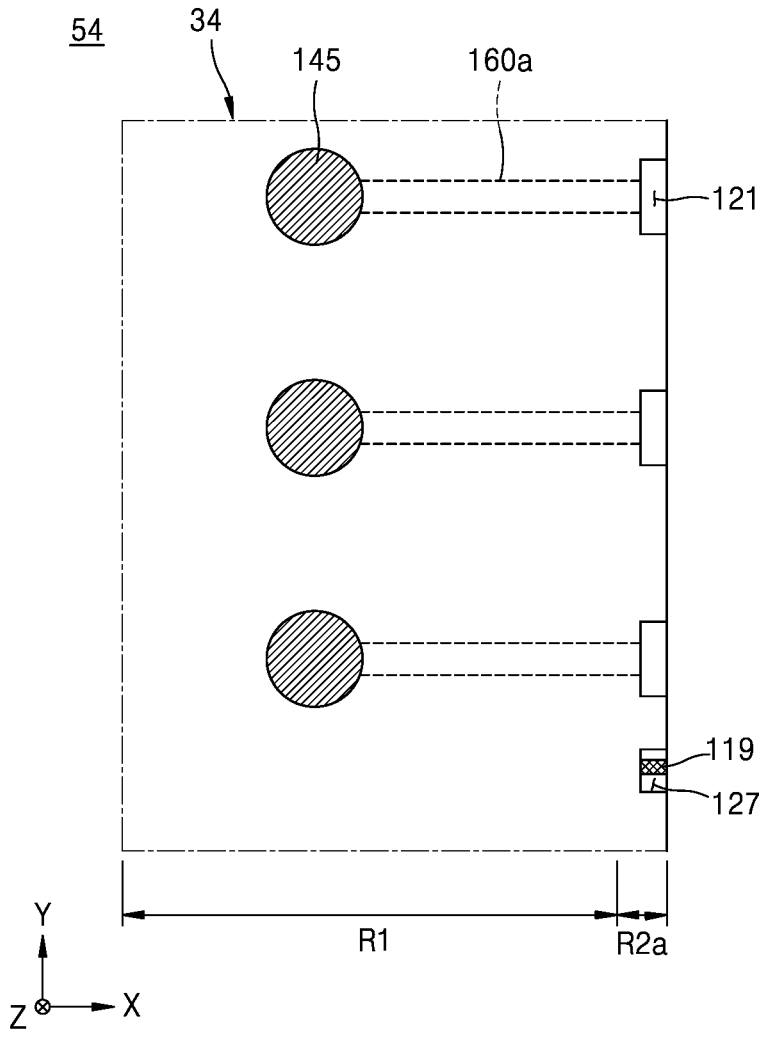
Figure 10E:
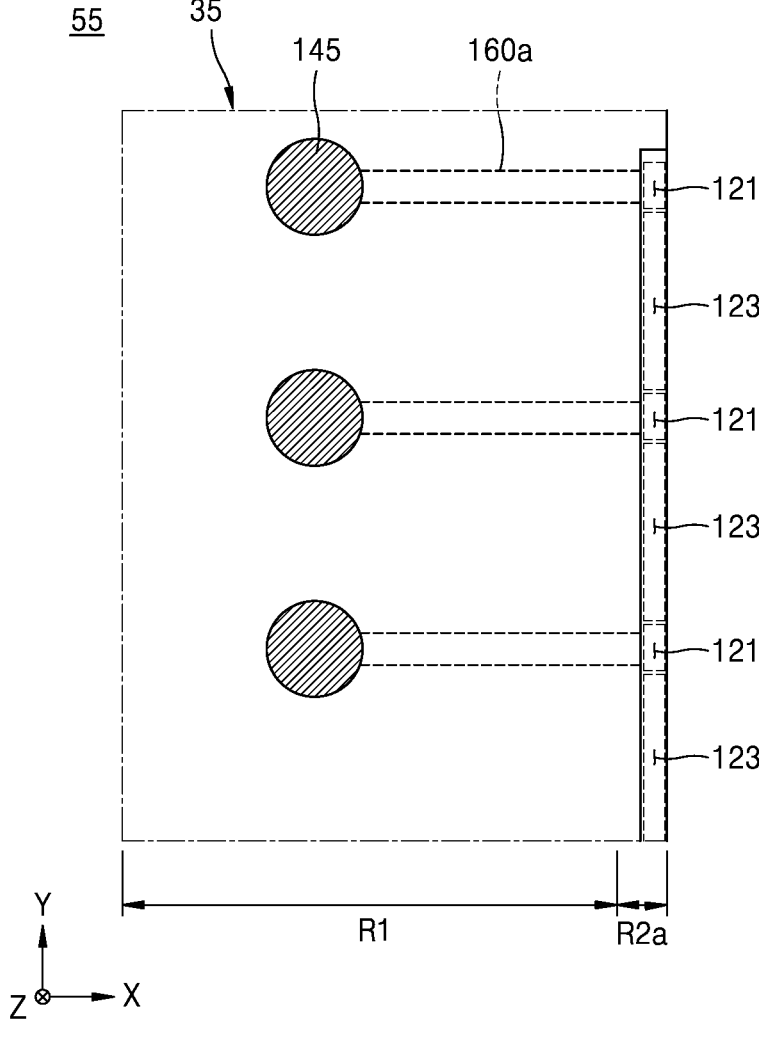
Figure 10F:
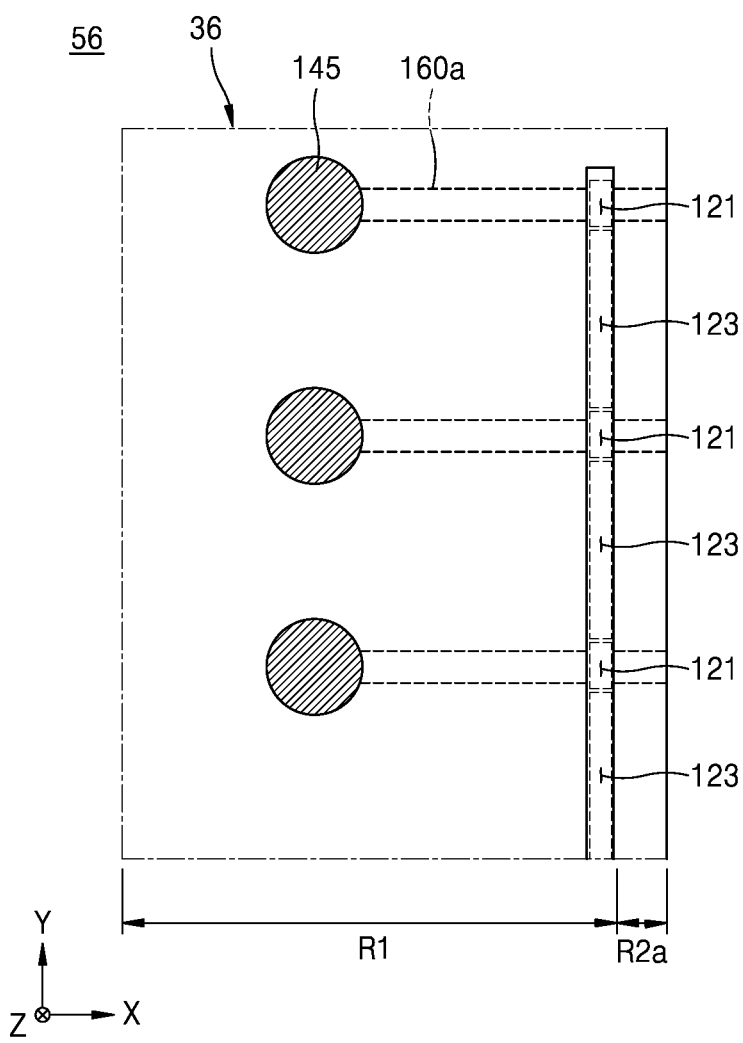
Figure 10G:
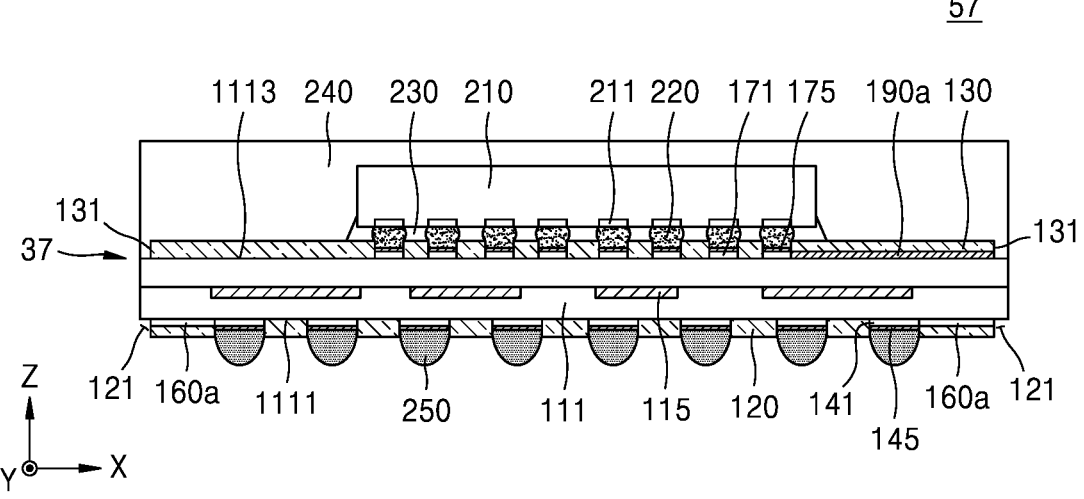
FIG. 10G is a cross-sectional view of a semiconductor package according to example embodiments.

FIGS. 10A to 10G are respectively diagrams of semiconductor packages 51, 52, 53, 54, 55, 56, and 57 according to example embodiments. FIGS. 10A to 10F are respectively bottom views of portions of the semiconductor packages 51, 52, 53, 54, 55, and 56. FIG. 10G is a cross-sectional view of the semiconductor package 57. The semiconductor packages 51, 52, 53, 54, 55, 56, and 57 of FIGS. 10A to 10G are described below, focusing on the differences from the semiconductor package 50 described above with reference to FIGS. 7 and 8.

Referring to FIG. 10A, the first through grooves 121 may be spaced apart from each other along an edge of the first insulating layer 120 or an edge of the semiconductor package 51. The first through grooves 121 may be spaced apart from an edge of a package substrate 31 toward the center of the package substrate 31. The first through grooves 121 may not be exposed at a side surface of the semiconductor package 51 or a side surface of the package substrate 31. For example, the package substrate 31 may be a structure obtained by cutting the package substrate 11 of FIG. 5A or a similar one along the scribe lane SL.

Referring to FIG. 10B, the first through grooves 121 may be arranged asymmetrically or in zigzag. For example, the first through grooves 121 may be spaced apart from each other in the first horizontal direction (e.g., the Y direction), which is parallel with the extension direction of the edge of the first insulating layer 120. Two first through grooves 121 adjacent to each other in the first horizontal direction (e.g., the Y direction) may be offset from each other in the second horizontal direction (e.g., the X direction), which is perpendicular to the extension direction of the edge of the first insulating layer 120. The edge of the first insulating layer 120 may be formed in the cutting process along the scribe lane SL. In example embodiments, some of the first through grooves 121 may be exposed at a side surface of the semiconductor package 52 or a side surface of a package substrate 32, and the rest of the first through grooves 121 may not be exposed at the side surface of the semiconductor package 52 or the side surface of the package substrate 32. For example, the package substrate 32 may be a structure obtained by cutting the package substrate 13 of FIG. 5C or a similar one along the scribe lane SL.

Referring to FIG. 10C, the first through grooves 121 may be arranged asymmetrically or in zigzag. None of the first through grooves 121 may be exposed at a side surface of a package substrate 33. For example, the package substrate 33 may be a structure obtained by cutting the package substrate 14 of FIG. 5D or a similar one along the scribe lane SL.

Referring to FIG. 10D, the first insulating layer 120 may include the groove 127, which is adjacent to an edge of the first insulating layer 120, and the conductive pattern 119 in the groove 127. The conductive pattern 119 may be configured to transmit an input/output data signal, a power signal, and/or a ground signal, which are provided to a package substrate 34. For example, the package substrate 34 may be a structure obtained by cutting the package substrate 15 of FIG. 5E or a similar one along the scribe lane SL.

Referring to FIG. 10E, the first insulating layer 120 may include at least one bridge groove 123, which extends between some of the first through grooves 121. For example, the first through grooves 121 may be connected to each other through bridge grooves 123. When the first through grooves 121 are connected to each other through the bridge grooves 123, the first insulating layer 120 may include the at least one bridge groove 123 (e.g., at least one trench), which linearly extends along an edge of the first insulating layer 120. For example, the at least one bridge groove 123 may extend along a straight line extending in the Y direction. The first through grooves 121 and the at least one bridge groove 123 may be exposed at a side surface of the semiconductor package 55 or a side surface of a package substrate 35. For example, the package substrate 35 may be a structure obtained by cutting the package substrate 16 of FIG. 5F or a similar one along the scribe lane SL.

Referring to FIG. 10F, the first through grooves 121 and the bridge grooves 123 may be spaced apart from an edge of the first insulating layer 120 or an edge of the semiconductor package 56 and may not be exposed at a side surface of the semiconductor package 56 or a side surface of a package substrate 36. For example, the package substrate 36 may be a structure obtained by cutting the package substrate 17 of FIG. 5G or a similar one along the scribe lane SL.

Referring to FIG. 10G, a package substrate 37 may include at least one second branch line pattern 190a connected to the second conductive pad 171. The second branch line pattern 190a may be on the second surface 1113 of the base insulating layer 111 and may extend along the second surface 1113 of the base insulating layer 111. The second insulating layer 130 may include a second through groove 131 overlapping the second branch line pattern 190a in a plan view. The second through groove 131 may be at an edge of the second insulating layer 130 or spaced apart from the edge of the second insulating layer 130. The second through groove 131 may be filled with the molding layer 240. The molding layer 240 may be in contact with the second surface 1113 of the base insulating layer 111 through the second through groove 131. For example, a plurality of second branch line patterns 190a may be on the second surface 1113 of the base insulating layer 111 and spaced apart from each other. The second insulating layer 130 may include a plurality of second through grooves 131 in the extension paths of the second branch line patterns 190a in a plan view. The second through grooves 131 may be spaced apart from each other along the edge of the second insulating layer 130. The arrangement of the second through grooves 131 may be substantially the same as or similar to that of the first through grooves 121. For example, similar to the first through grooves 121 in FIG. 3, the second through grooves 131 may be arranged asymmetrically or in zigzag. For example, the package substrate 37 may be a structure obtained by cutting, along the scribe lane SL, the package substrate 19 of FIG. 6A, the package substrate 20 of FIG. 6B, or a package substrate similar to the package substrate 19 or 20.

While the inventive concept has been particularly shown and described with reference to embodiments thereof, it will be understood that various changes in form and details may be made therein without departing from the spirit and scope of the following claims.

What is claimed is:

1. A package substrate comprising:
a base insulating layer including a first surface and a second surface opposite to the first surface;
a first main line pattern on the first surface of the base insulating layer;
a plurality of first conductive pads on the first surface of the base insulating layer;
a plurality of first branch line patterns on the first surface of the base insulating layer, each first branch line pattern among the plurality of first branch line patterns extending between the first main line pattern and a corresponding first conductive pad among the plurality of first conductive pads; and
a first insulating layer on the first surface of the base insulating layer, the first insulating layer including a plurality of first through grooves spaced apart from the first main line pattern,
wherein each first branch line pattern of the plurality of first branch line patterns includes a first cut portion, a first segment, and a second segment, the first segment and the second segment being separated from each other by the first cut portion between the first segment and the second segment, and
wherein each first through groove of the plurality of first through grooves overlaps a first cut portion of a corresponding first branch line pattern among the plurality of first branch line patterns.

2. The package substrate of claim 1, further comprising:
a plurality of first conductive cover layers on the plurality of first conductive pads, respectively.

3. The package substrate of claim 1,
wherein the first main line pattern extends along a first straight line extending in a first direction along the first surface of the base insulating layer,
wherein each first through groove of the plurality of first through grooves has a first horizontal width in the first direction and a second horizontal width in a second direction perpendicular to the first direction,
wherein the first horizontal width is between about 80 μm and about 12 mm, and
wherein the second horizontal width is between about 80 μm and about 400 μm.

4. The package substrate of claim 1,
wherein the first main line pattern extends along a first straight line extending in a first direction along the first surface of the base insulating layer, and
wherein two adjacent first through grooves among the plurality of first through grooves are spaced apart from each other in a diagonal direction between the first direction and a second direction that is perpendicular to the first direction.

5. The package substrate of claim 4,
wherein, when viewed in a plan view, the first main line pattern extends along the first straight line between the two adjacent first through grooves among the plurality of first through grooves.

6. The package substrate of claim 1,
wherein the first main line pattern extends along a first straight line extending in a first direction along the first surface of the base insulating layer, and
wherein the first insulating layer further includes a bridge groove between two adjacent first through grooves, spaced apart from each other in the first direction, among the plurality of first through grooves.

7. The package substrate of claim 6,
wherein, when viewed in a plan view, the bridge groove extends along a second straight line extending in the first direction, the second straight line being spaced apart from the first straight line in a second direction perpendicular to the first direction.

8. The package substrate of claim 1, further comprising:
a second conductive pad on the second surface of the base insulating layer;
a second branch line pattern on the second surface of the base insulating layer, the second branch line pattern being connected to the second conductive pad; and
a second insulating layer on the second surface of the base insulating layer, the second insulating layer including a second through groove,
wherein the second branch line pattern includes a second cut portion, a third segment, and a fourth segment, the third segment and the fourth segment being separated from each other by the second cut portion between the third segment and the fourth segment, and
wherein the second through groove overlaps the second cut portion of the second branch line pattern.

9. The package substrate of claim 8, wherein the third segment of the second branch line pattern is connected to the first main line pattern.

10. The package substrate of claim 8, further comprising:

a second main line pattern on the second surface of the base insulating layer, the second main line pattern being connected to the third segment of the second branch line pattern, wherein the second through groove is spaced apart from the second main line pattern.

11. A package substrate comprising:

a base insulating layer including a first surface and a second surface opposite to the first surface;

a first main line pattern extending along a first straight line extending in a first direction on the first surface of the base insulating layer;

a plurality of first conductive pads on the first surface of the base insulating layer;

a plurality of first branch line patterns on the first surface of the base insulating layer, each first branch line pattern of the plurality of first branch line patterns extending between the first main line pattern and a corresponding first conductive pad among the plurality of first conductive pads; and a first insulating layer on the first surface of the base insulating layer, the first insulating layer including a plurality of first through grooves, wherein the plurality of first branch line patterns are connected to the first main line pattern at a plurality of contact points that are spaced apart from each other in the first direction, wherein each first branch line pattern of the plurality of first branch line patterns includes a first cut portion, a first segment, and a second segment, the first segment and the second segment being separated from each other by the first cut portion between the first segment and the second segment, wherein each first through groove among the plurality of first through grooves overlaps a first cut portion of a corresponding first branch line pattern among the plurality of first branch line patterns, and wherein, when viewed in a plan view, two adjacent first through grooves, in a diagonal direction between the first direction and a second direction, among the plurality of first through grooves are spaced apart from each other by the first main line pattern therebetween, the second direction being perpendicular to the first direction.

12. A semiconductor package comprising:

a package substrate; and a semiconductor chip mounted on the package substrate, wherein the package substrate includes:

a base insulating layer including a first surface and a second surface opposite to the first surface;

a plurality of first conductive pads on the first surface of the base insulating layer;

a plurality of first branch line patterns on the first surface of the base insulating layer, the plurality of first branch line patterns being connected to the plurality of first conductive pads; and a first insulating layer on the first surface of the base insulating layer, the first insulating layer including a plurality of first through grooves extending through the first insulating layer in a vertical direction perpendicular to the first surface of the base insulating layer and each of the plurality of first through grooves exposing a corresponding portion of the first surface of the base insulating layer, wherein, when viewed in a plan view, the plurality of first conductive pads are arranged in a first direction, and wherein, when viewed in the plan view, each first branch line pattern of the plurality of first branch line patterns extends along a straight line extending in a second direction different from the first direction and extends from a corresponding first conductive pad among the plurality of first conductive pads toward a corresponding first through groove among the plurality of first through grooves, the corresponding first conductive pad and the corresponding first through groove being arranged along the straight line extending in the second direction.

13. The semiconductor package of claim 12, wherein each first branch line pattern of the plurality of first branch line patterns includes a first segment and a second segment separated from each other by a first cut portion between the first segment and the second segment, and wherein each first through groove of the plurality of first through grooves overlaps a first cut portion of a corresponding first branch line pattern of the plurality of first branch line patterns.

14. The semiconductor package of claim 13, wherein, when viewed in the plan view, the plurality of first through grooves are spaced apart from each other in the first direction, and wherein an edge of the package substrate extends in the first direction.

15. The semiconductor package of claim 14, wherein two adjacent first through grooves in the first direction among the plurality of first through grooves are spaced apart from each other in the second direction that is perpendicular to the first direction.

16. The semiconductor package of claim 13, wherein at least one of the plurality of first through grooves is exposed at a side surface of the package substrate.

17. The semiconductor package of claim 13, wherein the plurality of first through grooves are spaced apart from an edge of the package substrate, and wherein each first through groove among the plurality of first through grooves is disposed between the edge of the package substrate and a corresponding first conductive pad of the plurality of first conductive pads.

18. The semiconductor package of claim 17, wherein, when viewed in the plan view, in each first branch line pattern among the plurality of first branch line patterns, the first segment extends along the straight line from the edge of the package substrate to a corresponding first through groove among the plurality of first through grooves, and the second segment extends along the straight line from the corresponding first through groove to a corresponding first conductive pad among the plurality of first conductive pads, and wherein an end of the first segment is exposed to the outside of the package substrate.

19. The semiconductor package of claim 13, wherein the first insulating layer further includes a bridge groove disposed between two adjacent first through grooves among the plurality of first through grooves.

20. The semiconductor package of claim 19,
wherein, when viewed in the plan view, the bridge groove extends along a straight line extending in the first direction.

* * * * *